(12) United States Patent
Nakamura et al.

(10) Patent No.: US 8,178,920 B2
(45) Date of Patent: May 15, 2012

(54) SEMICONDUCTOR DEVICE AND METHOD OF FORMING THE SAME

(75) Inventors: Shun-ichi Nakamura, Matsumoto (JP); Yoshiyuki Yonezawa, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 406 days.

(21) Appl. No.: 12/574,805

(22) Filed: Oct. 7, 2009

(65) Prior Publication Data

US 2010/0019250 A1    Jan. 28, 2010

Related U.S. Application Data

(62) Division of application No. 11/624,160, filed on Jan. 17, 2007, now abandoned.

(30) Foreign Application Priority Data

Jan. 17, 2006  (JP) .................................. 2006-008995

(51) Int. Cl.
*H01L 29/76* (2006.01)

(52) U.S. Cl. ........... 257/330; 257/E29.257; 257/E29.26; 257/335; 438/270

(58) Field of Classification Search ............ 438/137, 438/270, 212, 587, 589; 257/77, 328, 329, 257/330, 335, E29.257, E29.26, E29.262
See application file for complete search history.

(56) References Cited

U.S. PATENT DOCUMENTS

| | | | |
|---|---|---|---|
| 4,541,001 A | 9/1985 | Schutten et al. | |
| 4,542,396 A | 9/1985 | Schutten et al. | |
| 4,546,367 A | 10/1985 | Schutten et al. | |
| 4,553,151 A | 11/1985 | Schutten et al. | |

(Continued)

FOREIGN PATENT DOCUMENTS

JP    02-102579 A    4/1990

(Continued)

OTHER PUBLICATIONS

Masahito Kodama et al., "Temperature Characteristics of a New 100V Rated Power MOSFET, VLMOS (Vertical LOCOS MOS)", Proceedings of 2004 International Symposium on Power Semiconductor Devices & ICs, pp. 463-466.

(Continued)

*Primary Examiner* — David Vu
(74) *Attorney, Agent, or Firm* — Rossi, Kimms & McDowell LLP

(57) ABSTRACT

A semiconductor device and a method of forming thereof has a base body has a field stopping layer, a drift layer, a current spreading layer, a body region, and a source contact region layered in the order on a substrate. A trench that reaches the field stopping layer or the substrate is provided. A gate electrode is provided in the upper half section in the trench. In a section deeper than the position of the gate electrode in the trench, an insulator is buried that has a normal value of insulation breakdown electric field strength equal to or greater than the value of the insulation breakdown electric field strength of the semiconductor material of the base body. This inhibits short circuit between a gate and a drain due to insulation breakdown of an insulator film at the bottom of the trench to realize a high breakdown voltage in a semiconductor device using a semiconductor material such as SiC. The sidewall surfaces of the trench located below the gate electrode is inclined to form a trapezoidal profile.

19 Claims, 10 Drawing Sheets

U.S. PATENT DOCUMENTS

| | | | |
|---|---|---|---|
| 4,577,208 A | 3/1986 | Schutten et al. | |
| 5,637,898 A * | 6/1997 | Baliga | 257/330 |
| 5,963,807 A | 10/1999 | Ueno | |
| 6,057,558 A | 5/2000 | Yamamoto et al. | |
| 6,180,958 B1 | 1/2001 | Cooper | |
| 7,470,960 B1 * | 12/2008 | Sugawara | 257/401 |
| 2004/0232486 A1 | 11/2004 | Disney et al. | |
| 2005/0230686 A1 | 10/2005 | Kojima et al. | |
| 2008/0012026 A1 | 1/2008 | Tsuji | |
| 2008/0258213 A1 | 10/2008 | Yilmaz et al. | |

FOREIGN PATENT DOCUMENTS

| | | |
|---|---|---|
| JP | 07-326755 A | 12/1995 |
| JP | 10-308512 A | 11/1998 |
| JP | 2002-043572 A | 2/2002 |
| JP | 2002-118256 A | 4/2002 |
| JP | 2002-217415 A | 8/2002 |
| JP | 2003-069038 A | 3/2003 |
| JP | 2005-101255 A | 4/2005 |

OTHER PUBLICATIONS

R. Van Dalen et al., "Electrical Characterisation of Vertical Vapor Phase Doped (VPD) RESURF MOSFETs", Proceedings of 2004 International Symposium on Power Semiconductor Devices & ICs, pp. 451-454.

Di Gao et al., "High-selectivity Etching of Polycrystalline 3C-SiC Films Using HBr-based Transformer Coupled Plasma", Applied Physics Letters, Mar. 17, 2003, pp. 1742-1744, vol. 82, No. 11, American Institute of Physics.

"Low-loss Sic Power MOSFET With Power Loss Reduced to 1/40 as Compared With Conventional MOSFETs has Been Developed", Dec. 13, 2004, ROHM Co., LTD.

* cited by examiner

SEMICONDUCTOR DEVICE AND METHOD OF FORMING THE SAME

CROSS REFERENCE TO RELATED APPLICATION

This is a divisional of application Ser. No. 11/624,160 filed 17 Jan. 2007, the contents of which are incorporated herein by reference in their entirety.

BACKGROUND

A high breakdown voltage power device fabricated with SiC has the potential of significantly reducing the on-state-resistance. For example, according to the press release from Rohm Co., Ltd., an SiC MOSFET (a Field Effect Transistor with a Metal-Oxide-Semiconductor structure) to be mass-produced by Rohm Co., Ltd. is to have its on-state-resistance becoming a half the on-state-resistance of an Si IGBT (Insulated Gate Bipolar Transistor) having the same breakdown voltage class. See An SiC power MOSFET has been developed with a less power loss of 1/40 of conventional one!" at http://www.rohm.co.jp/news/sicpower-j.html, circa Jun. 30, 2005.

A high breakdown voltage MOSFET of SiC as a principal material thereof is expected to be shipped from each semiconductor device maker within the next one or two years. In the future, most of IGBTs of Si as inverter parts are expected to be substituted by IGBTs of SiC, while reducing the cost and improving their electrical characteristics. Mass producing SiC devices, however, can be problematic in that an SiC wafer is very expensive in comparison with an Si wafer. Presently, the unit price per unit area of an SiC wafer is several tens of times the unit price per unit area of an Si wafer. Therefore, at the development of a SiC device, it is very important to enhance the current driving capability per unit area.

Currently, the condition at the $SiO_2$/SiC interface is not so good as the condition at the $SiO_2$/Si interface. Therefore, the carrier mobility in its MOS channel at the $SiO_2$/SiC interface is on the order of several tens $cm^2/Vs$, which is approximately one order smaller than the carrier mobility in its MOS channel at the $SiO_2$/Si interface. Therefore, in a high breakdown voltage device of SiC, it is important to reduce the on-state-resistance due to its MOS channel.

Moreover, in an SiC device, the resistance in its drift region is very small in comparison with that in an Si device. This makes the resistance in the MOS channel (channel resistance) occupy most of the resistance in the device. Therefore, the current driving capability of an SiC device is determined mainly by the channel density per unit area of the device.

The structures of vertical MISFETs, such as vertical MOSFETs, can be roughly classified into DMOSFET types (an example of which is shown in FIG. 15) and trench MOSFET types (an example of which is show in FIG. 16). In each of the figures, reference numeral 1 denotes a substrate, which is to be a drain region. Reference numerals 2, 3, 4, 5, 6, 7, 8, 9 and 10 denote a drift layer, a body region, a source contact region, a body contact region, a gate oxide film, a gate electrode, an interlayer insulator film, a source electrode and a drain electrode, respectively. In FIG. 16, reference numeral 11 denotes a trench.

In each of FIG. 15 and FIG. 16, a structure having one gate electrode is shown as a unit structure. In an actual device, however, many of the unit structures are repeatedly arranged. These figures are not drawn to an actual scale (which would only show a hairline when drawn in an actual scale) but is exaggeratedly illustrated with a scale different from the actual for illustration purposes (the same applies to other drawings). Moreover, the same or similar elements are designated with the same reference numerals with redundant explanation thereof omitted.

As show in FIG. 15, in a DMOSFET type, in the on-state, electrons, having passed through a MIS ("MOS" when the insulator film 6 is an oxide film) channel 12 formed at the interface with the gate oxide film 6 in the body region 3, flow in a JFET region 13 between the body regions 3 to the substrate 1 through the drift layer 2. In the off-state, the JFET region 13 basically comes to a pinch-off state with most part of the applied voltage carried by its p-n junction between the body region 3 and the drift layer 2. Therefore, at around the gate electrode 6, the electric field strength is considerably reduced.

In the structure shown in FIG. 15, however, the presence of p-n junctions on both sides of the JFET region 13 causes a depletion layer to extend from each of the p-n junctions toward the JFET region 13 by the length corresponding to the built-in voltage of each of the p-n junctions, forming a narrowed current path. This increases the resistance in the JFET region 13 (hereinafter referred to as "JFET resistance").

Reducing the width of the unit structure shown in FIG. 15, i.e., reducing the cell pitch, for enhancing the current driving capability per unit area reduces the width of the JFET region 13. However, the amount of narrowing in the current path due to the JFET effect is left unchanged. This reduces the proportion of the section with no narrowed current path in the JFET region 13, increasing the JFET resistance.

Such increase in the JFET resistance is unfavorable because it increases the loss in the on-state. Moreover, a too narrow width of the JFET region 13 pinches off the JFET region 13 by the built-in potential of each of the p-n junctions, which causes an abrupt increase in the JFET resistance. Therefore, there is a certain lower limit in the width of the JFET region 13, which also limits the lowest cell pitch.

The trench MOSFET type shown in FIG. 16, however, has no JFET region. Thus, in the on-state, electrons having passed through the MIS (MOS) channel 12 immediately enter the drift layer 2 to reach the substrate 1. Such absence of a JFET region provides no JFET resistance, which allows reduction in the cell pitch more than that of the DMOSFET type. Therefore, in the trench MOSFET type, the current driving capability per unit area can be enhanced more than in the DMOSFET type.

In the trench MOSFET type structure, in the off-state, the electric field strength becomes the highest in the vicinity of the interface of the p-n junction formed of the body region 3 and the drift layer 2. Moreover, in the off-state, an electric flux enters into an insulator film between the gate electrode 7 and the drift layer 2 at the bottom of the trench 11 with the density approximately equal to the density of the electric flux in the vicinity of the p-n junction formed of the body region 3 and the drift layer 2. Here, what becomes equal in all of the semiconductor and the insulator film is not the electric field strength but the electric flux density or a product of relative permittivity and electric field strength (hereinafter referred to as "electric field strength and relative permittivity product").

In Si, the insulation breakdown electric field strength is on the order of 0.3 MV/cm and its relative permittivity is on the order of 12. In $SiO_2$, which is mainly used as an insulator film, the normal value of the insulation breakdown electric field strength (hereinafter referred to as "normal insulation breakdown electric field strength") is 2.5 to 3 MV/cm and its relative permittivity is approximately a little less than 4. Therefore, when using Si as a semiconductor, the electric field strength and relative permittivity product due to the electric flux entering into the $SiO_2$ as an insulator film is less than 3.6 MV/cm unless electric field crowding occurs. This value corresponds to approximately on the order of 1 MV/cm or less in electric field strength, which causes no particular problem.

Here, the reason for using a normal insulation breakdown electric field strength about $SiO_2$ is as follows. An insulator, in particular an insulator in an amorphous state such as $SiO_2$ used in a semiconductor process, does not breakdown even though an electric field with high strength is instantaneously applied thereto. However, an electric field with high strength applied to the insulator for a long time deteriorates the insulator gradually over time until it eventually breaks down.

Therefore, to ensure that the insulator functions for a specified device life time, the design of the device must be carried out with a specified electric field strength, lower than the instantaneous insulation breakdown electric field strength, determined as an upper limit, so that no electric field with strength higher than the upper limit is applied to the insulator. Thus, the specified electric field strength lower than the instantaneous insulation breakdown electric field strength is used for the design basis as the normal insulation breakdown electric field strength.

To avoid electric field crowding in Si, a structure where $SiO_2$ is made to share an applied voltage (as in the example shown in FIG. 17) has been proposed. See Masahito Kodama, et al., *Temperature characteristics of a new 100V rated power MOSFET, VLMOS (Vertical LOCOS MOS)*", Proceedings of 2004 International Symposium on Power Semiconductor Devices & ICs, pp. 463-466 (2004). In the structure shown in FIG. 17, the trench 11 is formed deep to reach the substrate 1. Moreover, a RESURF structure is formed so that a thick $SiO_2$ field insulator film 14 isolates the gate electrode 7 from the substrate 1 and the drift layer 2. About the field insulator film 14, the gate electrode 7 and the substrate 1 (as a drain region) are made obviously close to each other. This makes it evident that an electric field is applied to the $SiO_2$ with a higher strength in comparison with the strength of the electric field applied to the Si.

In general, in a power device, when the device suffers a breakdown by an overvoltage, it is necessary to avoid a short circuit between the gate and the drain that occurs without the source and the drain being short-circuited. The reason is as follows. Normally, in each of high voltage circuits on the source and drain sides, measures are taken against the short circuit between the source and the drain. Therefore, should the source and the drain be short-circuited, only the device is burnt out, or only a few other power devices operating in cooperation with the device or only passive elements are burnt out. In comparison, in a control circuit on the gate side, the breakdown voltage thereof is generally low. Therefore, when a high voltage on the drain side is applied to the gate by a short circuit between the gate and the drain, the control circuit on the gate side become damaged. Then, the destructive high voltage is transmitted from the control circuit to the neighboring low voltage circuits from one to another to possibly causing fatal damages of the entire system using the power device. To prevent such a situation, it is possible to add a Zener diode with a sufficiently large capacity to the gate circuit. This, however, is not only economically undesirable but also decreases performance, such as by increasing the switching loss, reducing the switching speed, and distorting the control signal waveform due to charge and discharge of the Zener diode carried out at each switching.

Thus, it is not desirable to incorporate such a design where the breakdown voltage of the device is determined by the breakdown voltage between the gate and the drain. To ensure a sufficiently high breakdown voltage between the gate and the drain, it is necessary for the device to have such a device structure where a high breakdown voltage between the gate and the drain can be ensured even in the case where the insulation breakdown electric field strength of the semiconductor is considerably high.

Incidentally, the reason for enabling a significant reduction in the on-state-resistance using SiC is as follows. Since the insulation breakdown electric field strength of SiC is higher than that of Si, an SiC device, brought into realization with a breakdown voltage being the same as that of a Si device, is allowed to have a drift layer thinner than that of the Si device. Moreover, the amount of doping in the drift layer in the SiC device can be made higher than that in the Si device. Thus, the resistance of the drift layer in the SiC device can be reduced by two orders or more in comparison with that of the Si device.

However, a vertical trench MISFET using SiC, otherwise having the same structure as the Si device as shown in FIG. 16 causes the following problem. SiC has a relative permittivity on the order of 9.6 to 10, which is not much different from that of Si. In comparison, the insulation breakdown electric field strength of SiC is 1.5 to 2.5 MV/cm, which is 5 to 8 times higher than that of Si. Thus, from the value of the electric field strength and relative permittivity product in the $SiO_2$ insulator film at the bottom of the trench 11 in the structure as shown in FIG. 16, it is known that an electric field with excessive strength is to be applied to the $SiO_2$ insulator film.

Therefore, the breakdown voltage of the device is determined by the normal insulation breakdown electric field strength of the insulator film at the bottom of the trench 11 rather than the breakdown voltage of the p-n junction formed of the body region 3 and the drift layer 2. As a solution to this problem, a structure as in the example shown in FIG. 18 is known, where, when the drift layer 2 is an n-type, a buried p-type region 15 is provided at the bottom of the trench 11 so that the buried p-type region 15 is kept at the source potential. See for example U.S. Pat. No. 6,180,958.

As another structure for avoiding an electric field with excessive strength from being applied to the insulator film at the bottom of the trench, proposes increasing the thickness of the insulator film at the bottom of the trench. See for example JP-A-2-102579 and JP-A-7-326755). Other solutions include lowering the breakdown voltage of the p-n junction diode formed mainly of a body region and a drift region, and causing electric field crowding in the section other than the bottom of the trench. See for example JP-A-10-308512.

In the structure shown in FIG. 18, however, the p-n junction formed with the buried p-type region 15 and the drift region 2 causes a depletion layer to extend into the drift layer 2 by a length approximately corresponding to the built-in potential of the p-n junction. As a result, the current path is narrowed, increasing the resistance of the device. This is essentially the same as the JFET effect in principle. Namely, the buried p-type region 15 provided at the bottom of the trench causes the JFET effect, which should have been avoided by employing the trench MOSFET type structure. This, like in the case in the DMOSFET structure, imposes limitation on reducing the cell pitch. Therefore, as was explained above, in an SiC device using an expensive SiC wafer, despite the importance of cell pitch reduction, the main effect of reducing the cell pitch, which is obtained by providing the trench MOSFET type structure, is lost.

Moreover, in each of the structures disclosed in JP-A-2-102579 and JP-A-7-326755, the breakdown voltage thereof is limited by the electric field strength in the insulator film at the bottom of the trench rather than the electric field strength in SiC. Thus, it cannot be said that a full use is made of a high value of the insulation breakdown electric field strength of SiC. Furthermore, the structure disclosed in JP-A-10-308512 has a drawback in that it prevents realization of a high breakdown voltage expected from the high value of the insulation breakdown electric field strength of SiC.

Accordingly, there remains a need for a semiconductor device that can avoid the above-explained problems and inhibit a short circuit between a gate and a drain due to breakage of the insulator film at the bottom of a trench, to enable realization of a high breakdown voltage. The present invention addresses this need.

SUMMARY OF THE INVENTION

The present invention relates to a semiconductor device and a method of forming the same that uses a semiconductor material, such as SiC (silicon carbide), that has a larger band gap than that of silicon. In particular, the present invention relates to a semiconductor device forming a vertical MISFET (a Field Effect Transistor with a Metal-Insulator-Semiconductor structure) having a trench gate structure.

One aspect of the invention is a semiconductor device. The device can include a base body formed of semiconductor material, the base body having a trench formed from the top surface thereof, a body region provided on the top surface side of the base body, a source region provided on the top surface side of the body region, a drain region provided on the bottom surface side of the base body, a drift layer provided in the base body between the source region and the drain region, a highly doped layer forming at least part of the drain region, a gate insulator film formed of insulating material provided at least on a sidewall surface of the trench, and a gate electrode provided in the trench with the gate insulator film provided at least between the sidewall surface of the trench.

The trench penetrates the base body and the drift layer and reaches the highly doped layer on the drain region side. A section of the trench deeper than the gate electrode can be filled with an insulator having a normal value of an insulation breakdown electric field strength equal to or higher than the value of the insulation breakdown electric field strength of the semiconductor material of the base body. The insulator at the bottom end of the gate electrode is thicker than the drift layer.

The product of a value of the insulation breakdown electric field strength and a value of the relative permittivity of the semiconductor material forming the base body is larger than the product of a normal value of an insulation breakdown electric field strength and a value of the relative permittivity of the insulating material forming the gate insulator film.

A semiconductor region becoming the drift layer can be of an n type and fixed charges existing in the insulator filling the trench can be positive. Alternatively, the semiconductor region becoming the drift layer can be of a p type and fixed charges existing in the insulator filling the trench can be negative.

The semiconductor material forming the base body is SiC, and each of the gate insulator film and the insulator filling the trench can be an insulator including $SiO_2$ as a principal ingredient thereof.

The semiconductor material forming the base body is 4H—SiC with the {0001} plane thereof taken as a principal surface of the base body, the normal value of the insulation breakdown electric field strength of the insulator filling the trench is 2.5 MV/cm or more, and a product of the normal value of the insulation breakdown electric field strength and the value of the relative permittivity of the insulator is 25 MV/cm or less.

The semiconductor material forming the base body can be one of 4H—SiC with the {11$\bar{2}$0} plane thereof taken as a principal surface of the base body, 6H—SiC with the {11$\bar{2}$0} plane thereof taken as a principal surface of the base body, 6H—SiC with the {01$\bar{1}$4} plane thereof taken as a principal surface of the base body, or 4H—SiC with the {03$\bar{3}$8} plane thereof taken as a principal surface of the base body, and the normal value of the insulation breakdown electric field strength of the insulator filling the trench can be 1.8 MV/cm or more, and the product of the normal value of the insulation breakdown electric field strength and the value of the relative permittivity of the insulator can be 18 MV/cm or less.

The semiconductor material forming the base body can be 3C—SiC, the normal value of the insulation breakdown electric field strength of the insulator filling the trench can be 1.5 MV/cm or more, and the product of the normal value of the insulation breakdown electric field strength and the value of the relative permittivity of the insulator can be 15 MV/cm or less.

The value of the insulation breakdown electric field strength of the semiconductor material forming the base body can be 3 MV/cm or less, the product of the value of the insulation breakdown electric field strength and the value of the relative permittivity of the semiconductor material can be 12 MV/cm or more, and the insulator filling the trench can be $SiO_2$.

The plane of the semiconductor material forming the base body, the plane having an off orientation angle of 10° or less from the crystal plane of the semiconductor material, can be taken as the principal surface of the base body.

The value of the relative permittivity of the gate insulator film can be larger than the value of the relative permittivity of the insulator filling the trench.

When an electric field is applied to the base body side of an interface between the insulator filling the trench and the base body in such a way as to be perpendicular to the interface with a value of strength becoming $\sqrt{5/9}$ times of the value of the insulation breakdown electric field strength of the semiconductor material forming the base body, the drain region and a semiconductor region becoming a body region in the base body have characteristics where the drain region and the semiconductor region becoming the body region are not completely isolated from each other by a depletion layer spreading into the semiconductor region in the base body and by the insulator filling the trench.

Letting the value of the insulation breakdown electric field strength and the value of the relative permittivity of the semiconductor material forming the base body be $E_S$ and $\epsilon_S$, respectively, and letting the normal value of the insulation breakdown electric field strength and a value of a relative permittivity of the insulator filling the trench be $E_I$ and $\epsilon_I$, respectively, when an electric field is applied to the base body side of an interface between the insulator filling the trench and the base body in such a way as to be perpendicular to the interface with a value of strength becoming $\{(E_I/E_S)^2-1\}/\{(\epsilon_S/\epsilon_I)^2-1\}$ times of $E_S$, the drain region and a semiconductor region becoming a body region in the base body have characteristics where the drain region and the semiconductor region becoming the body region are not completely isolated from each other by a depletion layer spreading over in the insulator filling the trench and the semiconductor region in the base body.

Another aspect of the present invention is forming the above described semiconductor device, which can be a vertical MISFET.

BRIEF DESCRIPTION OF THE DRAWINGS

FIG. 3-1 is a cross-sectional view showing a structure of a principal part of a trench MOSFET according to a first embodiment according to the invention.

FIG. 3-2 is a cross-sectional view showing another structure of a principal part of a trench MOSFET according to the first embodiment.

FIG. 4-1 is a cross-sectional view showing yet another structure of a principal part of a trench MOSFET according to the first embodiment.

FIG. 4-2 is a cross sectional view showing yet another structure of a principal part of a trench MOSFET according to the first embodiment.

DETAILED DESCRIPTION

Figure 1:
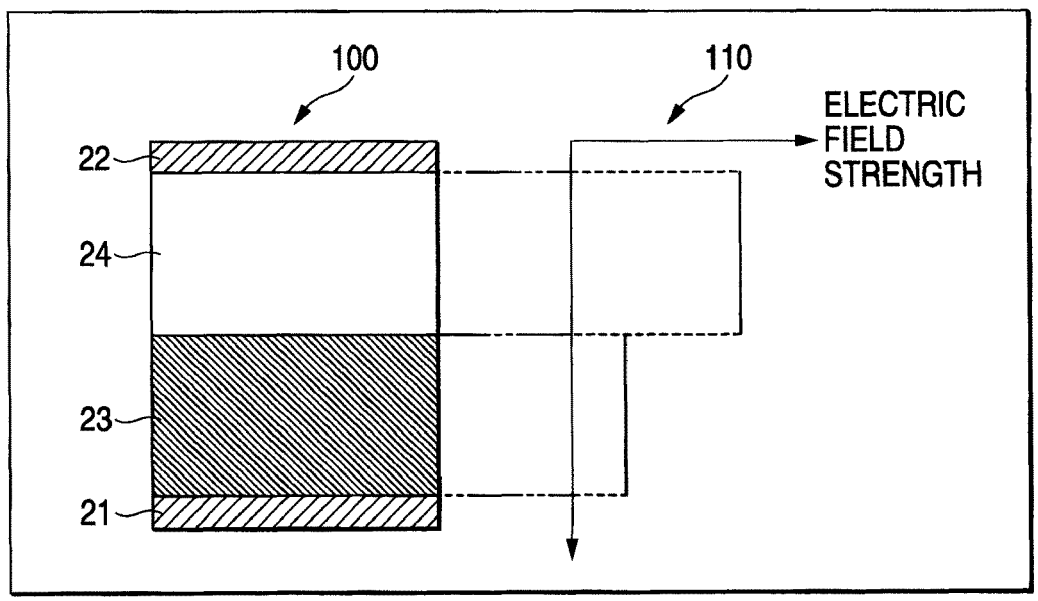
FIG. 1 is a view showing a cross section of an arrangement of a one-dimensional model in which a semiconductor and an insulator are arranged in series, and a characteristic diagram of an electric field strength distribution in the depth direction of the model.

The present inventors carried out the following studies. The studies will be explained in the following with an assumption that the major carriers here are electrons because the mobility of electrons is larger than that of holes in SiC and a device with electrons functioning as major carriers is more preferable. In a device with holes functioning as major carriers, however, electrons and n-type and polarity signs of a charge and an electric potential can be substituted by holes and p-type and reverse polarity signs, respectively, with the directions of an electric field, an electric flux density and a line of electric force reversed.

Here, explanations will be made with an example where 4H—SiC is used as a semiconductor material of a base body and a material including $SiO_2$ as the principal ingredient thereof is used as an insulating material buried in a trench. However, the present device is not to be limited to such a combination. Incidentally, in a related trench structure, when an insulating material, having a smaller relative permittivity in comparison with that of the base body as in the above combination, is used, an electric field with excessive strength is applied to the insulating material.

In contrast, according to the invention, the strength of electric field that is approximately equal to the strength of the electric field applied to the semiconductor material in the device, is applied to the insulating material regardless of its relative permittivity by a structure that takes better advantage of laws of electromagnetics. Therefore, when the normal insulation breakdown electric field strength of the insulating material buried in a trench is equal to or larger than the insulation breakdown electric field strength of the semiconductor material to be a substrate, any combination of insulation material and semiconductor material can be used.

Of the semiconductor materials commercially available or actually producible, those with their values having the insulation breakdown electric field strength 2 to 3 MV/cm or more and with control of their conduction types of both the p- and n-types being relatively easy are generally limited to SiC and some compound crystals with each of their main ingredients being Column III-nitride semiconductor, for example, GaN or Ga-based arrays. The Column III-nitride semiconductors, however, except AlN being substantially an insulating material, generally have smaller thermal conductivities than Si. Therefore, it is not preferable to use a Column III-nitride semiconductor singly as the semiconductor material for a vertical power device in which a current is required to flow with a large current density.

Enhancing the current driving capability per unit area increases the power density per unit area. This inevitably increases the amount of heat produced per unit area in the device. This is because the switching loss due to the capacitance between the source and the drain, and the capacitance between the gate and the drain cannot be reduced though the on-state-resistance directly affecting the conduction loss that can be reduced. From such situation, SiC is the most suited at present for a semiconductor material for a vertical power device.

SiC has many types of polytypes (crystal structures). Commercially available polytypes of SiC are limited to 3C, 6H and 4H. It is known that each of the 6H—SiC and 4H—SiC has a strong anisotropy in both the electron mobility and the insulation breakdown electric field strength therein. Moreover, the relative permittivity thereof is also regarded as having a little anisotropy. 3C—SiC is regarded as having a small anisotropy in physical property values thereof.

The physical property values of the polytypes are shown in the Table. In a vertical power device, each of the direction in which electrons travel in the on-state and the main direction of an electric field in the off-state is in the direction approximately perpendicular to the principal surface of the base body. In the Table, physical values in the direction perpendicular to the principal surface of the base body are therefore taken as the typical values of the physical properties.

THE TABLE

| | POLYTYPE | | | | |
|---|---|---|---|---|---|
| | 4H | | 6H | | 3C |
| DIRECTION OF PLANE | {0001} | {11$\bar{2}$0} | {0001} | {11$\bar{2}$0} | (001) |
| ELECTRON MOBILITY (cm$^2$/Vs) | 1120 | 940 | 150 | 500 | 1000 |
| INSULATION BREAKDOWN ELECTRIC FIELD STRENGTH (MV/cm) | 2.5 | 1.8 | 2.8 | 1.8 | 1.5 |
| RELATIVE PERMITTIVITY | 10 | 9.7 | 10 | 9.7 | 9.7 |
| BALIGA'S FIGURE OF MERIT | 403 | 138 | 75 | 72 | 76 |

In the Table, Baliga's figure of merit is a value obtained by calculating three physical property values of electron mobility, insulation breakdown electric field strength, and relative permittivity, and is proportional to the reciprocal of the theoretical lower limit value of the on-state-resistance to a specified breakdown voltage. Therefore, a higher Baliga's figure of merit is more preferable. From the Table, it is known that 4H—SiC is preferable because it has the largest electron mobility and has a sufficiently large insulation breakdown electric field strength in each direction of plane. In particular, the use of 4H—SiC with the {0001} plane thereof taken as the principal surface of the base body is preferable because the theoretical lower limit value of the on-state-resistance is small.

In expressing Miller-Bravais indices, a "–" sign means a bar above the figure directly behind the sign. Namely, when the "–" sign is attached just before the figure of a Miller-Bravais index, it is meant that a plane specified by the Miller-Bravais indices intercepts a coordinate axis of a hexagonal lattice corresponding to the figure attached with the "–" sign on the negative side of the origin.

The insulating material buried in the trench must satisfy at least the following four requirements. First, the insulating material should not adhere to the sidewall in the section in which the gate is positioned in the trench, the insulating material, even when the material adheres to the section, should be easily removable thereafter while being well controlled, or the material itself should become a part or the whole of the gate insulator film. Second, the insulating material should be buried in the trench that is considerably deep for the width of the opening thereof, and should have no void or no crack, which reduces the breakdown voltage, in the buried region. Third, the insulating material should not contaminate the gate insulator film or the gate electrode. Fourth, the insulating material should be capable of withstanding the storing conditions and the operating conditions of the device, and should be capable of thermally and chemically withstanding in the entire device processes carried out after the insulating material is buried in the trench. Requirements for the relative permittivity and the insulation breakdown electric field strength will be explained later. Insulating materials that satisfy the requirements are quite limited. When the semiconductor material is SiC, SiO$_2$ or an insulating material including SiO$_2$ as the principal ingredient thereof can satisfy the above four requirements.

The study of an electric field strength distribution below the bottom of the trench (on the drain side) will be carried out by considering a one-dimensional model of a system made up of a semiconductor and an insulator, while letting the permittivity of the semiconductor be higher than the permittivity of the insulator, and the semiconductor be an n type with a small donor concentration (small impurity concentration).

FIG. 1 is a cross sectional view showing the arrangement of the one-dimensional model. In FIG. 1, in addition to the cross-sectional view showing the one-dimensional model 100, a characteristic diagram 110 showing the electric field strength distribution in the direction of the depth of the model is also shown. As shown, the one-dimensional model 100 has an arrangement in which a semiconductor 23 and an insulator 24 is arranged in series between a pair of metal electrodes 21 and 22. When a voltage is applied perpendicularly to the interface between the semiconductor 23 and the insulator 24, an electric flux density is conserved at the interface. Moreover, the permittivity of the semiconductor 23 being higher than the permittivity of the insulator 24 causes the electric field strength in the insulator 24 to be higher than the electric field strength in the semiconductor 23 as shown in the characteristic diagram 110. Since the semiconductor 23 is an n type with a small donor density, the variation in the electric field strength in the semiconductor 23 is regarded as being small and is neglected.

What is important here is that the design is to be carried out on the consideration that insulation breakdown occurs when the electric field strength in the semiconductor 23 reaches the insulation breakdown electric field strength or when the electric field strength in the insulator 24 reaches the normal insulation breakdown electric field strength. For example, the instantaneous insulation breakdown electric field strength of a SiO$_2$ film obtained by thermal oxidation of Si reaches as high as 10 MV/cm or more. However, when an electric field with such a high strength is applied all the time, the life of the device cannot be assured. Therefore, the design is usually carried out so that no electric field with such a strength exceeding 2.5 to 3 MV/cm is applied to SiO$_2$.

To obtain a breakdown voltage of the device expected from the insulation breakdown electric field strength in the semiconductor, the electric field strength in the insulator must not exceed the normal insulation breakdown electric field strength when the electric field strength in the semiconductor reaches the insulation breakdown electric field strength. When a voltage is applied perpendicularly to the interface between the semiconductor 23 and the insulator 24 as shown in FIG. 1, electric flux densities in the semiconductor 23 and the insulator 24 become equal to each other as explained above. Thus, the electric field strength and relative permittivity products in the semiconductor 23 and the insulator 24 become equal to each other.

When the electric field strength in the semiconductor 23 reaches the insulation breakdown electric field strength, the product of the insulation breakdown electric field strength in the semiconductor 23 and the relative permittivity in the semiconductor 23 (hereinafter referred to as "insulation breakdown electric field strength and relative permittivity product") becomes equal to the insulation breakdown electric field strength and relative permittivity product in the insulator 24. When the electric field strength in the insulator 24 at this time exceeds the normal insulation breakdown voltage electric field strength, namely, when the insulation breakdown electric field strength and relative permittivity product of the semiconductor 23 is larger than the product of the normal insulation breakdown electric field strength and the relative permittivity (hereinafter referred to as "normal insulation breakdown electric field strength and relative permittivity product") of the insulator 24, the breakage of the insulator 24 possibly occurs first. Thus, when the device is a trench MISFET, short circuit between the gate and the drain possibly occurs.

As in previously explained $SiO_2$, when there is several times difference between the instantaneous insulation breakdown electric field strength and the normal insulation breakdown electric field strength of an insulator, even though the insulation breakdown electric field strength and relative permittivity product of a semiconductor is larger than the normal insulation breakdown electric field strength and relative permittivity product of an insulator, it sometimes appears that resistance to breakdown can be maintained. However, the resistance can be kept for a short time, so that practically sufficient life is not always assured.

As an example, consider the case in which the semiconductor is Si or SiC and the insulator is $SiO_2$. The values of the insulation breakdown electric field strength, the relative permittivity and the insulation breakdown electric field strength and relative permittivity product of Si are 0.3 MV/cm, 12 and 3.6 MV/cm, respectively. The values of the insulation breakdown electric field strength, the relative permittivity and the normal insulation breakdown electric field strength and relative permittivity product of SiC are 1.5 to 2.5 MV/cm, around 10 and 15 to 25 MV/cm, respectively. The values of the normal insulation breakdown electric field strength, the relative permittivity and the normal insulation breakdown electric field strength and relative permittivity product of $SiO_2$ are 2.5 to 3 MV/cm, around 4 and 10 to 12 MV/cm, respectively.

Comparing Si and $SiO_2$ shows that the normal insulation breakdown electric field strength and relative permittivity product of $SiO_2$ is on the order of three times or more larger than the insulation breakdown electric field strength and relative permittivity product of Si. Therefore, in the one-dimensional model, there is no issue of the insulation breakdown of $SiO_2$ first even with the arrangement shown by the model 100 in FIG. 1. However, comparing SiC and $SiO_2$ shows that the normal insulation breakdown electric field strength and relative permittivity product of $SiO_2$ is only on the order of 40 to 80 percent of the insulation breakdown electric field strength and relative permittivity product of SiC. Therefore, with the arrangement shown by the model 100 in FIG. 1, there is a high risk of causing the insulation breakdown of $SiO_2$ first. In other words, when using a semiconductor with a large insulation breakdown electric field strength and relative permittivity product, such as SiC, a device structure must avoid the arrangement shown by the model 100 in FIG. 1.

Figure 2:
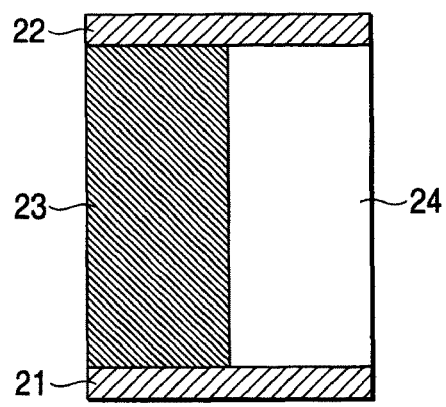
FIG. 2 is a cross-sectional view showing an arrangement of a one-dimensional model in which a semiconductor and an insulator are arranged in parallel.

Next, consider the example shown in FIG. 2 in which the semiconductor 23 and the insulator 24 are held parallel between a pair of the metal electrodes 21 and 22 with a voltage applied parallel with the interface between the semiconductor 23 and the insulator 24. In this case, the direction of the electric field becomes parallel with the interface between the semiconductor 23 and the insulator 24. With the variation in the electric field strength distribution by ionized donors in the semiconductor 23 being ignored, the values of the electric field strength in the semiconductor 23 and the insulator 24 become equal to each other regardless of large or small of values of the relative permittivities of the semiconductor 23 and the insulator 24. Namely, when the normal insulation breakdown electric field strength of the insulator 24 is larger than the insulation breakdown electric field strength in the semiconductor 23, no short circuit is caused between the gate and the drain due to breakdown of the insulator 24 that occurs first. In the combination of SiC and $SiO_2$, the normal insulation breakdown electric field strength of $SiO_2$ is equal to or larger than the insulation breakdown electric field strength of SiC. Therefore, with the arrangement shown in FIG. 2, there is no issue of first causing the insulation breakdown of $SiO_2$.

Normally, in a vertical MISFET, a highly doped layer known as a field stopping layer is provided on the drain side. After the drift layer is completely made depleted, the electric field strength abruptly reduces in the field stopping layer to almost zero. The section deeper than this, like becomes part of the drain electrode. Therefore, as shown in, for example, FIG. 3-1, in the first embodiment of a semiconductor device according to the present invention, the depth of the trench 41 is configured so that the electric field strength therein becomes approximately zero, at least the insulation breakdown voltage on the semiconductor side. Moreover, in the section of the trench in the vicinity of a MIS channel 42, i.e., a section deeper than a gate electrode 37, an insulator 46 is kept buried. Such a structure enables realization of the electrical properties shown in FIG. 2.

Figures 1, 4:
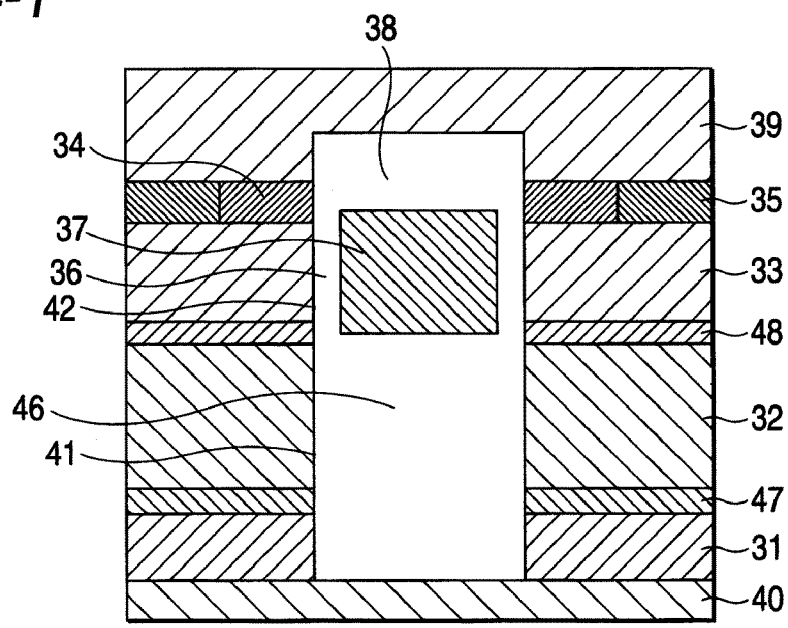
Figures 2, 4:
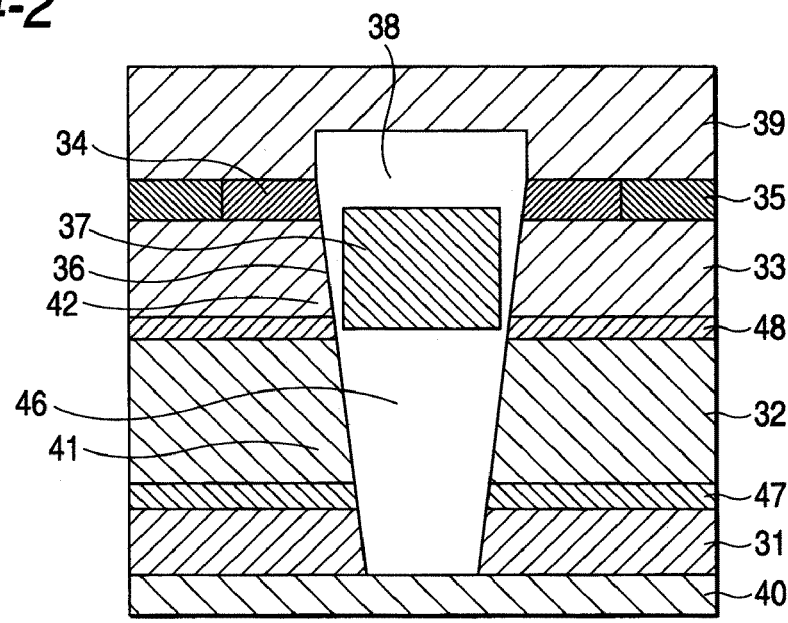

Moreover, when the normal insulation breakdown electric field strength of the insulator 46 buried in a deep section in the trench 41 (hereinafter referred to as "buried insulator") is equal to or larger than the insulation breakdown electric field strength of the semiconductor, the buried insulator 46 is first made to breakdown to prevent the short circuit between the gate and the drain. As shown in FIG. 4-1, which illustrates a modification of the first embodiment, the depth of the trench 41 can be deeper than the depth at which the electric field strength becomes zero at the insulation breakdown voltage on the semiconductor side. FIG. 4-1 shows an example where the trench 41 penetrates through its substrate 31. The insulator 46 can be different from the gate insulator film 36 in material. For example, with the insulator including $SiO_2$ as the principal ingredient thereof buried in the trench 41, the gate insulator film 36 can be a material having its relative permittivity higher than that of the insulator in the trench 41. Moreover, with the gate insulator film 36 being an insulator film including $SiO_2$ as the principal ingredient thereof, an insulating material having the relative permittivity lower than that of the gate insulator film 36 can be buried in the trench 41.

This way, it is preferable for the relative permittivity of the gate insulator layer 36 to be higher than that of the buried insulator 46. The reason is that the capacitance between the gate and the drain can be reduced without lowering the current driving capability of the gate. Moreover, directly under the gate electrode 37, an insulator with the same material as that of the gate insulator film 36 can be provided, or an insulator with the material thereof being neither that of the gate insulator film 36 nor that of the buried insulator 46 can be provided. As another choice, the buried insulator 46 can be made to contact the gate electrode 37.

The buried insulator 46 can be any one of a material of one kind or a material composed of materials of a plurality of kinds. For example, in the section at which the buried insulator 46 is in contact with the semiconductor, an insulator film including $SiO_2$ as the principal ingredient thereof can be present, and inside of the section, a material with the relative permittivity thereof being lower than that of the insulator 46 can be buried.

Figures 1, 3:
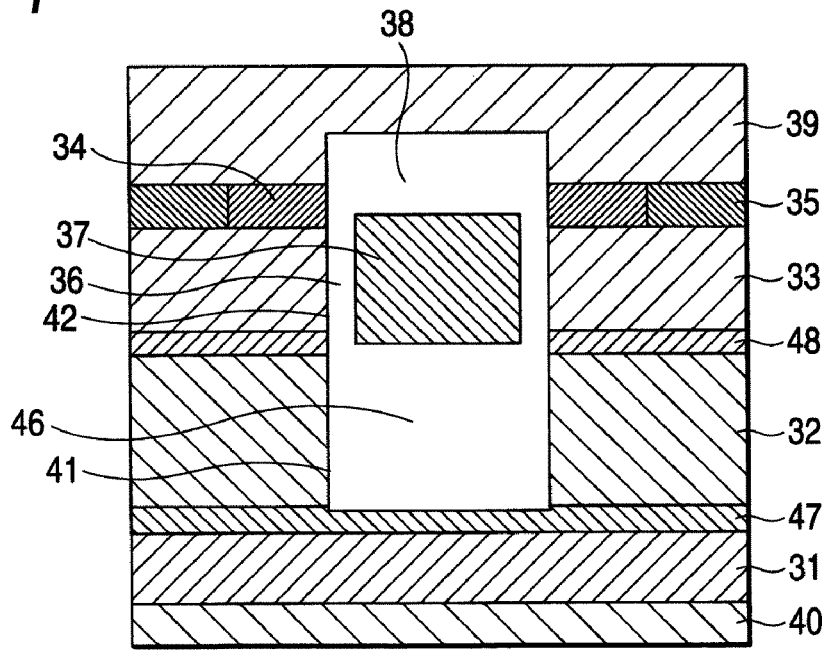
Figures 2, 3:
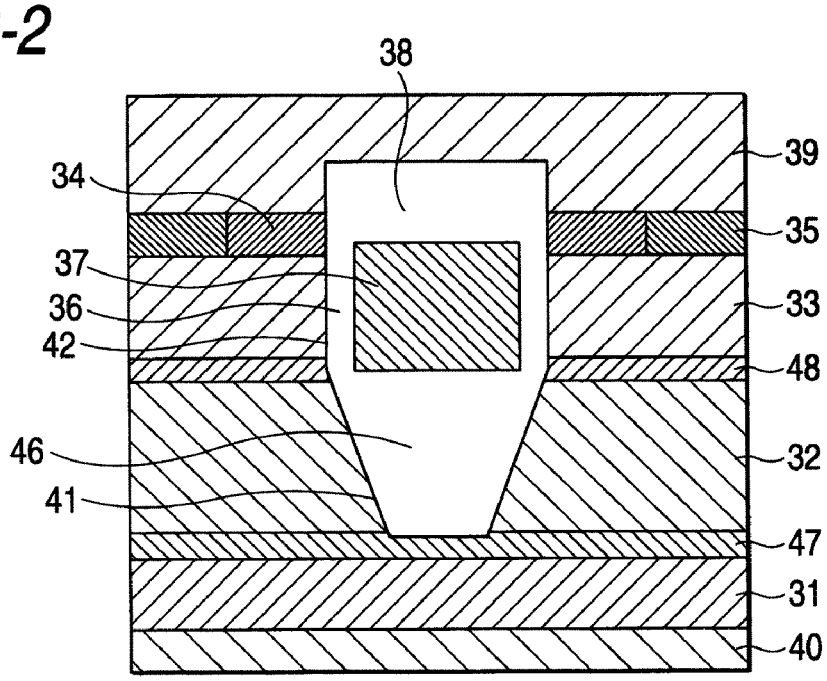

Arrangements of constituents other than the buried insulator 46 are not limited to those shown in FIG. 3-1 or FIG. 4-1 but can be variously modified. For example, a field stopping layer 47 can be part of the substrate 31. Moreover, a current spreading layer 48 can be eliminated. Furthermore, a source contact and a body contact can be taken in different ways from those shown in the example given in FIG. 3-1 or FIG. 4-1.

The gate electrode 37 can be arranged in any way as long as the top end thereof is positioned above the interface between a body region 33 and a source contact region 34 and that the bottom end thereof is positioned below the interface between the body region 33 and the current spreading layer 48 (a drift layer 32 in case of absence of the current spreading layer 48), but not positioned lower such that an electric field with excessive strength is applied to the buried insulator 46. Furthermore, when the above requirements are satisfied, the gate electrode 37 can be provided in any shape.

Moreover, the trench 41 in the vicinity of the MIS channel 42 needs not be approximately perpendicular to the principal surface of the substrate 31. In particular, the shape of the trench 41 in the vicinity of the MIS channel 42 can be selected as necessary so that channel resistance becomes low. Thus, the trench 41 can have any shape that enables realization of a device with a high breakdown voltage. FIGS. 3-2 and 4-2 illustrate some examples, namely having a trapezoidal shape in cross section.

Figure 5:
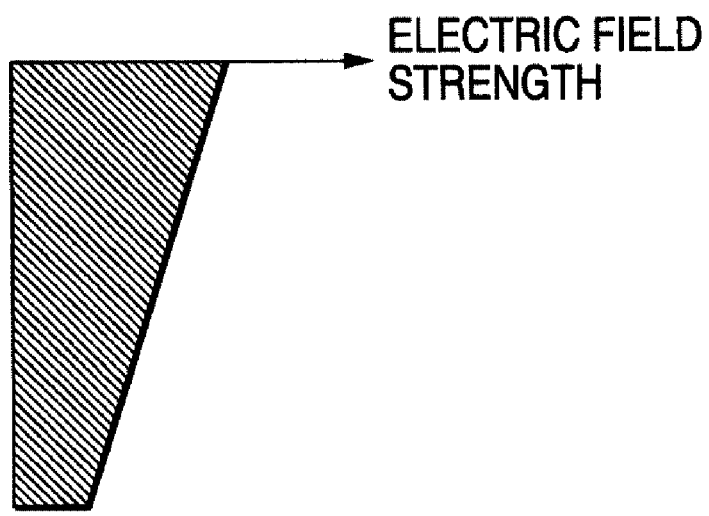
FIG. 5 is a characteristic diagram showing an electric field strength distribution in the depth direction in a drift layer when a donor concentration distribution therein is uniform.

In an actual application, donors that cannot be negligible exist in the drift layer. This makes the electric field strength in the drift layer not constant but causes the electric field strength to gradually reduce from the body region side toward the substrate or the field stopping layer side. As shown in FIG. 5, a characteristic diagram showing an electric field strength distribution in the depth direction in a drift layer when a donor density distribution therein is uniform, a uniform donor concentration makes the electric field strength distribution in the drift layer from the surface thereof like a trapezoid with one side being inclined at a certain angle. The inclination is proportional to the donor concentration and is inversely proportional to the relative permittivity.

For minimizing the on-state-resistance, it is preferable for the electric field strength at the boundary between the drift layer and the field stopping layer to become one-third of the electric field strength at the interface between the drift layer and the body region (equal to the insulation breakdown electric field strength of the semiconductor). No fixed charge is present inside an ideal insulator. Thus, as shown in FIG. 6, a characteristic diagram showing an electric field strength distribution in the depth direction inside an ideal insulator, the electric field strength distribution from the surface is uniform inside an ideal insulator and becomes a rectangle.

Figure 6:
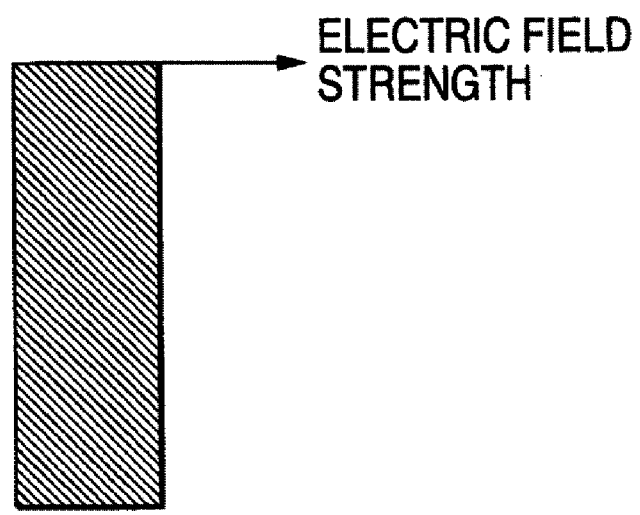
FIG. 6 is a characteristic diagram showing an electric field strength distribution in the depth direction inside an ideal insulator.

The area of each of the hatched trapezoidal section in FIG. 5 and the hatched rectangular section in FIG. 6 is equivalent to an applied voltage. Thus, both of the areas are equal. Namely, the value of the electric field strength in the insulator buried in the trench is equal to the average value of the electric field strength in the semiconductor. According to the design for minimizing the on-state-resistance, the electric field strength in the insulator buried in the trench becomes two-thirds of the insulation breakdown electric field strength.

With the electric field strength distributions in both of the semiconductor and the insulator being kept as they are, the difference in electric potential arises at the interface of the semiconductor and the insulator between the semiconductor side and the insulator side. Thus, at the interface, lines of electric force gradually enter the insulator from the underside of the semiconductor toward the upper side of the insulator to make the electric potentials on both of the semiconductor side and the insulator side equal to each other at the interface. This is a kind of electric field crowding. However, only for making the electric potentials equal to each other on both of the sides at the interface, no electric field with the strength thereof higher than the maximum electric field strength on the semiconductor side is applied to the insulator only by this effect.

In an actual device, for being operated as a MISFET, the bottom end of the gate electrode is invariably positioned under the body region. Therefore, the insulator buried in the trench has to bear the same voltage as that applied to the semiconductor with a length shorter than that of the semiconductor. Moreover, when the insulation breakdown electric field strength is high like in SiC, the donor concentration in the drift layer is high to such an extent that the donor density cannot be ignored compared with the acceptor density in the body region.

This causes a depletion layer to extend also to the body region at the off-state. As a result, the body region is also made to bear part of the applied voltage. Therefore, it is considered that an electric field with further large strength is seemingly applied to the insulator buried in the trench. However, as will be explained later about embodiment, when using at least SiC, the voltage borne by the body region is equal to or less than 5% of the applied voltage except the case where the design breakdown voltage is very low. Thus, the problem of increasing the electric field strength in the insulator is not so fatal.

A design breakdown voltage taken as being 1 kV or more requires the drift layer to have a thickness of 5 μm or more. Even though the bottom end of the gate electrode is positioned lower than the upper end of the drift layer by about 0.5 μm to be closer to the drain than the bottom end of the body region as a result of providing a processing margin, an increase in the electric field strength is 10% or less. Thus, also the problem of increasing the electric field strength in the insulator is not so fatal.

From the foregoing, normally, the rate of increase in electric field strength in the insulator is sufficiently estimated as being 15%. It is considered that even the rate of 10% is practically sufficient. For example, when the semiconductor is SiC and the insulator buried in the trench is $SiO_2$, the insulation breakdown electric field strength is 2.5 MV/cm.

When the above influence is taken into consideration, at the insulation breakdown of SiC, there arises a possibility that an electric field with strength of a little less than 2.9 MV/cm, 15% higher than the insulation breakdown electric field strength of SiC, is applied to the $SiO_2$. The value, however, is smaller than 3 MV/cm as the normal insulation breakdown electric field strength of $SiO_2$. Therefore, there is no first breakdown of $SiO_2$, which enables realization of a high breakdown voltage. However, the position of the lower end of the gate electrode must be adjusted so that the distance between the bottom end of the gate electrode and the field stopping layer becomes larger than at least the thickness of the drift layer.

When using SiC, a design breakdown voltage taken as being 1 kV or less influences various kinds of resistance, such as channel resistance, contact resistance of each of a source and a drain, and resistance of a substrate so that it become significant rather than the influence of the resistance of a drift layer. Therefore, a design voltage taken as being considerably lower than 1 kV is meaningless because the design voltage has no effect of lowering the on-state-resistance.

Some methods of forming insulators cause fixed charges to be produced in the insulators. For example, when forming $SiO_2$ by carrying out thermal oxidation of Si, it is considered that thermal oxidation carried out in a dry atmosphere is liable to produce positive fixed charges due to oxygen deficiency. On the other hand, it is considered that thermal oxidation carried out in a wet atmosphere is liable to produce negative fixed charges due to hydroxyl groups entrapped in $SiO_2$. The fixed charges cause variation in the electric field strength distribution in an insulator like ionized donors or acceptors in a semiconductor being made to deplete. The electric field strength distribution in the case with the presence of fixed charges in an insulator becomes the distribution having a certain inclination like that in the semiconductor in the case shown in FIG. 5. The inclination is proportional to the fixed charge density and inversely proportional to the relative permittivity.

In some cases, in a microscopic state, both the positive and negative fixed charges can be present in an insulator. However, as far as both of the charges are uniformly distributed in an insulator, what is important is only a charge density given as a result of summation of amounts of both of the positive and negative charges. In the following explanation, a charge density given as a result of summation of amounts of both of the positive and negative fixed charges is referred to as a "fixed charge density". When amounts of positive charges are dominant, it is regarded that the positive fixed charges with an amount corresponding to the fixed charge density are present in the insulator. While, when amounts of negative charges are dominant, it is regarded that the negative fixed charges with the amount corresponding to the fixed charge density are present in the insulator.

As shown in FIG. 2, when a semiconductor and an insulator are arranged parallel to be in contact with each other, for making the inclinations in electric field strength equal to each other in both of the semiconductor and the insulator, it is necessary only that a quotient, obtained by dividing the donor density in the semiconductor by the relative permittivity of the semiconductor, becomes equal to a quotient, obtained by dividing the fixed charge density in the insulator by the relative permittivity of the insulator. A fixed charge density when both the quotients become equal to each other is referred to as a "balanced charge density."

However, fixed charges in the insulator must be those with the same sign as the ionized donors, i.e., the positive fixed charges. When the above-explained requirements are not satisfied, the electric field with the direction thereof being constant over the semiconductor and the insulator, would cause a difference in electric potential between the semiconductor side and the insulator side at the interface of the semiconductor and the insulator. Thus, in this case, for making the electric potentials on both of the semiconductor side and the insulator side at the interface equal to each other, there exist lines of electric force crossing the interface.

When the density of positive fixed charges in the insulator is larger than the balanced charge density therein, lines of electric force are to run out from below the insulator toward above the semiconductor so as to compensate abrupt reduction of the electric field strength in the insulator. This seems to cause electric field concentration below the insulator. However, when the behavior of the lines of electric force is only for making the electric potentials on both sides of the semiconductor and the insulator equal to each other at the interface between the semiconductor and the insulator, no electric field, the strength thereof being larger than the strength of the original electric field in the semiconductor, is applied to below the insulator.

While, when the density of positive fixed charges in the insulator is smaller than the balanced charge density therein, lines of electric force are to run above the insulator from below the semiconductor so as to compensate the abrupt reduction of the electric field strength in the semiconductor. This seems to cause electric field concentration above the insulator. However, when the behavior of the lines of electric force is only for making the electric potentials on both sides of the semiconductor and the insulator equal to each other at the interface between the semiconductor and the insulator, no electric field, the strength thereof being larger than the strength of the original electric field in the semiconductor, is applied to above the insulator.

However, in the trench type MISFET shown in each of FIG. 3-1 and FIG. 4-1, the electric field strength in the insulator naturally tends to become high depending on the shared voltage in the body region and the position of the bottom end of the gate electrode as was explained above. This possibly causes the electric field strength to exceed the normal insulation breakdown electric field strength at the bottom end of the gate electrode.

When the polarity of fixed charges in the insulator is negative, the effect becomes more significant to make the electric field strength at the bottom end of the gate electrode become higher. This is because the insulator including negative fixed charges behaves like a depleted p-type semiconductor. Namely, by the insulator with negative fixed charges and an n-type semiconductor forming a drift layer, a state is provided as though a known superjunction structure is formed. The superjunction structure is generally a repeated structure in which n-type regions, each with an enhanced impurity concentration, and p-type regions are alternately joined. This produces a lateral electric field so that it crosses a junction interface between the insulator and the semiconductor. The electric field is unnecessary and high. In this case, when the insulation breakdown electric field strength of the semiconductor and the normal insulation breakdown electric field strength of the insulator are close to each other like in the combination of SiC and $SiO_2$, for example, there is a high possibility of undesirably breaking down the insulator first to unfavorably cause a short circuit between the gate and the drain.

As was explained above, when the semiconductor forming the drift layer is an n type, the insulator buried in the trench preferably has positive fixed charges to negative charges because the electric field strength near the bottom end of the gate electrode can be reduced. It is more preferable for the insulator buried in the trench to have positive fixed charges with a density of the order of the balanced charge density thereof. Moreover, it is further preferable for the insulator to have positive fixed charges with a density of the order of a little exceeding the balanced charge density thereof to an extent that the electric field strength at the bottom end of the gate electrode is reduced.

Figure 7:
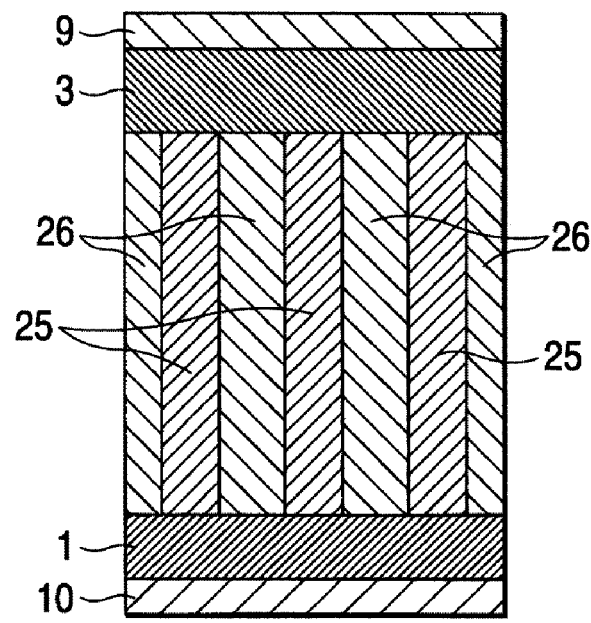
FIG. 7 is a cross-sectional view showing a typical superjunction structure.

In a typical superjunction structure shown in FIG. 7, a voltage is applied parallel with a junction interface of an n-type region 25 and a p-type region 26. The n-type region 25 and the p-type region 26, which are depleted by an electric field applied in the direction perpendicular to the junction interface, i.e., by a lateral electric field, enable realization of a high breakdown voltage of the structure. Although omitted in FIG. 7, a gate is provided on the superjunction structure to make the device function as a switching device. In the structure, in addition to considerable difficulty in making the charges in the n-type region 25 and the p-type region 26 balanced, at least one of the n-type region 25 and the p-type region 26 must be selectively formed. Therefore, it is difficult to make such a structure.

Figure 8:
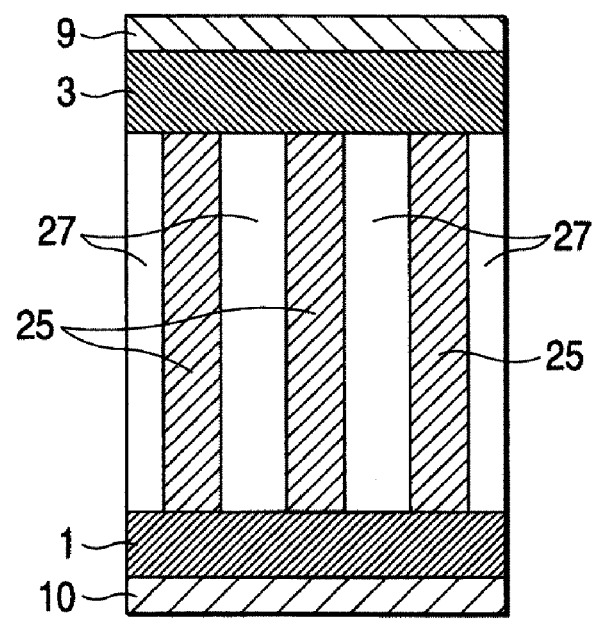
FIG. 8 is a cross-sectional view showing another related superjunction structure.

Thus, a proposal has been made as shown in FIG. 8 where an insulator 27 is used in place of the p-type region 26 to provide a substitute for the superjunction structure. The structure can be formed by forming trenches penetrating through a drift region and by filling each of the trenches with an insulator 27. The structure, unless negative fixed charges are produced in the insulator 27 filling the each of the trenches as a whole, does not function as a superjunction structure. In the following, the structure, with the substituted structure being included, is also to be referred to as a superjunction structure.

However, when such a structure is applied to a trench type MISFET, the electric field strength at the bottom end of the gate electrode, illustration thereof was omitted, becomes high as explained above. Therefore, when the insulation breakdown electric field strength of the semiconductor and the normal insulation breakdown electric field strength of the insulator are close to each other like in the combination of SiC and $SiO_2$, for example, there is a high possibility of breaking down the insulator first to unfavorably cause a short circuit between the gate and the drain.

In the superjunction structure, a lateral electric field being generated must be large to the extent that the drift layer becomes sufficiently depleted in the lateral direction. When the relative permittivity of the insulator is smaller than that of the semiconductor, in the insulator, a lateral electric field is generated with strength larger than that of the lateral electric field in the semiconductor.

According to the calculations carried out by the inventors, for the maximum electric field strength in the insulator not to exceed the normal insulation breakdown electric field strength in the insulator, of the insulation breakdown electric field strength of the semiconductor, the proportion shared to the lateral electric field must become smaller than the square root of the value given by the following expression (1). Moreover, for enabling realization of a structure with a breakdown voltage higher than that of an ordinary structure, the proportion must be smaller than $\sqrt{5/9}$. Here, the ordinary structure is referred to as a structure that is not the superjunction structure, namely, a structure with a drift layer thereof formed by a semiconductor layer being uniform with a single conductivity type.

$$\{(E_I/E_S)^2-1\}/\{(\epsilon_S/\epsilon_I)^2-1\}, \quad (1),$$

where, $E_S$, $\epsilon_S$, $E_I$, and $\epsilon_I$ are the insulation breakdown electric field strength of the semiconductor, the relative permittivity of the semiconductor, the normal insulation breakdown electric field strength of the insulator, and the relative permittivity of the insulator, respectively.

However, of the insulation breakdown electric field strength of the semiconductor, with the proportion shared to the lateral electric field having a value just equal to or nearly equal to the value given by the expression (1), it is possible for the maximum electric field strength in the insulator to unfavorably exceed the normal insulation breakdown electric field strength due to a slight error during the manufacturing of the device. Therefore, the device must be designed so that, of the insulation breakdown electric field strength of the semiconductor, the proportion shared with the lateral electric field have a value considerably smaller than the value given by the foregoing expression (1).

A large insulation breakdown electric field strength in the semiconductor causes the value given by the expression (1) to become small. For example, when the semiconductor is Si and the insulator is $SiO_2$, the value given by the expression (1) becomes 12 or more. Since the value is considerably larger than 5/9, there is no fear of causing the electric field strength in the insulator to become excessively large by an electric field in the lateral direction. However, when the semiconductor is 4H—SiC with a voltage applied in the <0001> direction and the insulator is $SiO_2$, the value given by the expression (1) is on the order of 0.09. When 3C—SiC is used, whose insulation breakdown electric field strength is regarded as being the smallest, the value given by the expression (1) is on the order of 0.58. Therefore, when forming the superjunction structure as shown in FIG. 8 with a combination of SiC and $SiO_2$, the design must be carried out with care so that no electric field with excessively large strength is applied to the insulator.

While, of the electric field applied to the semiconductor, when the proportion shared with the lateral electric field is small, for making the n-type region in the semiconductor depleted, a donor concentration must be reduced depending on the width (the case of one-dimensionally repeating an alternate arrangement of the n-type semiconductor regions and either one of the p-type semiconductor regions and the trench filled with an insulator is assumed). Therefore, in comparison with an ordinary structure with the same breakdown voltage, there is a possibility of making it impossible to reduce the on-state-resistance.

Reducing repetition pitches in the superjunction structure also reduces the widths of n-type regions. According to the calculation carried out by the present inventors, for reducing the on-state-resistance in comparison with that of an ordinary structure with the same breakdown voltage, in the simplest way, of the insulation breakdown voltage of a semiconductor, the proportion shared to the lateral electric field must be made larger than the value expressed by the following expression (2). When the value given by the expression (2) is not a real number, even with a superjunction structure, the on-state-resistance cannot be reduced smaller than that of an ordinary structure:

$$0.5-\sqrt{0.25-\{8\times E_S \div (27\times BV_D)\times (P\div 2)\}^2} \quad (2),$$

where $E_S$, $BV_D$, and P are the insulation breakdown electric field strength of the semiconductor, the design breakdown voltage, and the repetition pitch of the superjunction, respectively.

The larger the insulation breakdown electric field strength is and the larger the repetition pitch of the superjunction is, the larger the value given by the expression (2) becomes. On the other hand, the larger the design breakdown voltage is, the smaller the value given by the expression (2) becomes. For example, when a design breakdown voltage is 1 kV and a voltage is applied to 4H—SiC approximately in its <0001> direction, the repetition pitch of the superjunction taken as 8 μm makes the value given by the expression (2) become 0.096. This value is larger than the value (on the order of 0.08) given by the expression (1) under the same condition. Therefore, even with the superjunction structure as shown in FIG. 8, a tradeoff between the breakdown voltage and the on-state-resistance cannot be improved. A design breakdown voltage of 2 kV makes the value given by the expression (2) become 0.022. Thus, under such a simple assumption as in the expression (2), it seems that the tradeoff between the breakdown voltage and the on-state-resistance can be improved by providing a superjunction structure.

In practice, however, in the case of a superjunction structure, an applied voltage is 0V and a depletion layer spreads to some extent in an n-type region. This increases the on-state-resistance. In some cases, the n-type region is completely depleted. This is the same phenomenon as that in the JFET effect. In the case of the superjunction structure using the p-n junctions as shown in FIG. 7, the phenomenon just corresponds to the JFET effect, by which the on-state-resistance is increased by the amount corresponding to the spread depletion layer.

In the example in which the 4H—SiC is used and a design breakdown voltage is determined as 2 kV, letting the width of an n-type region be a half of the repetition pitch in the superjunction and a depletion layer spread to a length corresponding to a built-in potential of the order of 2.7V, which is the same as that in the case of using p-n junctions. In this case, with a design in which the value given by the expression (2) is closer to the above value 0.022, nearly 30% of the n-type region becomes depleted when an applied voltage is 0V. This results in an increase by as much as 30% or more in the actual on-state-resistance in comparison with the on-state-resistance in the case where no depletion layer is spread. Therefore, the on-state-resistance becomes higher than that in an ordinary structure.

According to a simple estimation, the design must be carried out so that the value equivalent to the square of the value of the proportion of the insulation breakdown electric field strength of the semiconductor shared with the lateral electric field, that is, the value that can be directly compared with the values given by the expressions (1) and (2), becomes on the order of 0.033 or more. The value is smaller than 0.08, which is the value given by the expression (1). Therefore, with the design carried out so that the value comes within the range, it is not impossible to improve the tradeoff between the breakdown voltage and the on-state-resistance by the superjunction structure.

However, the allowable design range is less than ±20% in terms of lateral electric field strength. Moreover, even though controllability is ensured within the range, the on-state-resistance can be reduced only to on the order of a little more than 60% of an ordinary structure. In the case of 4H—SiC, in this class of breakdown voltage, the contribution of the on-state-resistance of a drift layer to the whole on-state-resistance of the device is on the order of 20% or less. Therefore, even though the on-state-resistance can be reduced to this extent by forming a drift layer with a superjunction structure, no on-state-resistance more than 10% as that of the device can be reduced.

Furthermore, according to a similar estimation, a design breakdown voltage brought to 1.25 kV or less causes the value equivalent to the square of the value of the proportion of the insulation breakdown electric field strength of the semiconductor shared with the lateral electric field to become larger than the value given by the expression (1). Thus, even though a superjunction structure is formed, the on-state-resistance cannot be reduced. When the repetition pitch of the superjunction is large, or when the width of the n-type region is large, unless a higher breakdown voltage design is carried out, even though a superjunction structure is formed, the on-state-resistance cannot be reduced.

As was explained in the foregoing, with the superjunction structure shown in FIG. 8, except where a considerably high breakdown voltage is required, or where a sufficiently small repetition pitch can be brought into realization, an on-state-resistance reduction effect on a design breakdown voltage is little. Moreover, no effect can be obtained that matches the effort for the realization of the on-state-resistance reduction.

Figure 9:
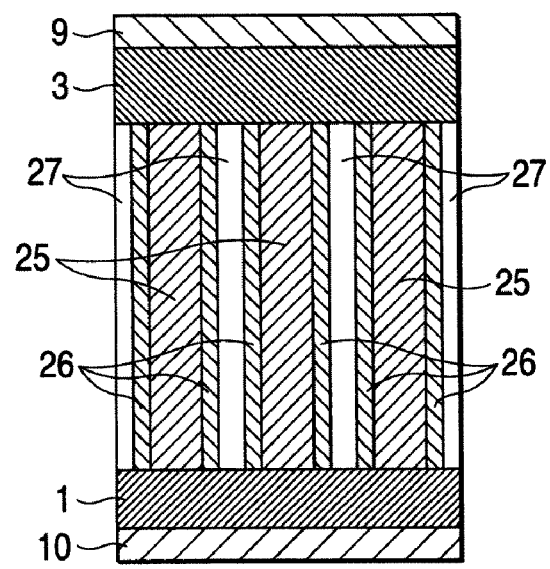
FIG. 9 is a cross-sectional view showing yet another related superjunction structure.

When the semiconductor is Si, for making a superjunction structure with p-n junctions easily formed, a structure shown in FIG. 9 has been proposed by R. van Dalen et al., *Proceedings of* 2004 *International Symposium on Power Semiconductor Devices & ICs*, Kitakyushu, pp. 451-454 (2004). The structure is formed by forming trenches in the drift layer that reach the drain, by providing a p-type region 26 with impurities made diffused on each of the surfaces of n-type regions 25, and by filling each of the trenches with an insulator 27. Some documents refer the structure as a kind of RESURF. The structure, however, is the same as a superjunction structure in that a high breakdown voltage is obtained by enhancing depletion with a lateral electric field. Therefore, the structure shown in FIG. 9 is also belongs in the superjunction structure category. In this structure, the lateral electric field strength is reduced in the p-type region 26. Therefore, the requirement for the value obtained by the expression (1) is relaxed depending on the width of the p-type region 26. However, it is apparent that the structure is more difficult to formed than the structure shown in FIG. 8.

In particular, in the case of using SiC, the diffusion coefficients of impurities are so small that it is not realistic to introduce impurities by a diffusion method after forming the trenches as in the case of using Si. Therefore, the p-type region is to be formed by epitaxial growth or ion implantation. However, when the trench has a high aspect ratio, forming such a structure is difficult by any method.

To enjoy the benefit of the superjunction structure, the repetition pitch must be small in a high breakdown voltage design, so that the aspect ratio of the trench becomes considerably high. Therefore, when a combination of SiC and $SiO_2$ is used, the superjunction structure shown in FIG. 9 is not realistic. The structure shown in FIG. 3-1 or FIG. 4-1 is more realistic.

In the structure according to the present invention, there is no need to strictly maintain a charge balance and to completely deplete the n-type region by the lateral electric field. Therefore, the pitch of the trench filled with an insulator or the shape of the arrangement of the trenches viewed from above the device, and the donor density in the n-type region can be independently selected. This provides high design freedom that allows tolerances in a device process to be taken larger than those in related superjunction structures.

In particular, in a vertical trench MISFET according to the present invention, even though the structure thereof is one that no longer effectively functions as a superjunction structure, the structure can avoid an electric field with excessive strength from being applied to the insulator under a gate electrode in comparison with the case where the insulator under a gate electrode does not reach a highly doped layer on the drain side. Therefore, the structure has the advantage of enabling realization of a high breakdown voltage.

Here, the structure that no longer effectively functions as a superjunction structure is one as explained in the following. Namely, perpendicularly to the interface between an insulator filling a trench and a semiconductor, an electric field is applied on the semiconductor side. The value of the strength of the electric field is equivalent to a smaller one of the value, for which the insulation breakdown electric field strength of the semiconductor is multiplied by $\sqrt{5/9}$, and the value, for which the insulation breakdown electric field strength of the semiconductor is multiplied by the square root of the value given by the expression (1). At this time, in the structure, the drain region and the body region in the semiconductor region are not completely isolated from each other by a depletion layer spreading into the semiconductor and by the insulator filling the trench.

The present device is not limited to the arrangement in which the conductivity type of the drift layer is an n-type and the insulator filling the trench has positive fixed charges. For example, when the conductivity type of the drift layer is a p-type, the insulator filling the trench can have negative fixed charges.

Moreover, when the donor concentration in the n-type drift layer is equivalent to the donor concentration derived from a one-dimensional model of an ordinary structure that is not the superjunction structure with respect to the desired breakdown voltage, within the range in which no electric field with excessive strength is applied to the bottom end of the gate electrode, the insulator filling the trench may have negative fixed charges. The same holds true for the case in which the conductivity type of the drift layer is a p-type. In this case, the insulator filling the trench can have positive fixed charges.

Referring to FIG. 3-1, which is a cross sectional view showing a structure of a principal part of a trench MOSFET according to a first embodiment, on the substrate 31, which is made of n-type 4H—SiC having a high impurity concentration with the $(0001)_{Si}$ plane thereof taken as the principal surface of the substrate 31, the n-type field stopping layer 47 with a high impurity concentration, the n-type drift layer 32 with a low impurity concentration, the n-type current spreading layer 48, the p-type body region 33 and the n-type source contact region 34 with a high impurity concentration are layered in the order from the substrate 31 side.

From the surface of the source contact region 34, the trench 41 is formed to penetrate through the body region 33, the current spreading layer 48, and the drift layer 32 to reach the field stopping layer 47. Opposite to the sidewall surface of the trench 41 including a section of the body region 33, a section near the body region 33 in the source contact region 34, and a section near the body region 33 in the current spreading region 48, the gate electrode 37 is provided with the gate insulator film 36 of an oxide film, for example, provided therebetween.

In the trench 41, a section below the gate electrode 37 is filled with the buried insulator 46 including $SiO_2$ as the principal ingredient thereof. Moreover, in the trench 41, a section above the gate electrode 37 and part of the surface of the source contact region 34, an interlayer insulator film 38 is formed. The rest of the surface of the source contact region 34 is in contact with a source electrode 39.

The source electrode 39 covers the interlayer insulator film 38 and is in contact with a source contact region in an adjacent cell (not shown). Part of the source electrode 39 is in contact with a p-type body contact region 35 with a high impurity concentration. The body contact region 35 is formed with part thereof entering into the body region 33. On the other principal surface (the bottom surface) of the substrate 31, a drain electrode 40 is provided.

The principal surface of the substrate 31 can be the $(000\bar{1})_C$ plane. Moreover, the principal surface can be a plane having a deviation within several degrees, for example, 10°, of off orientation angle from the {0001} plane. With any plane of the principal surface of the substrate 31, a high breakdown voltage can be obtained unless a fatal crystal defect is produced, irregularity is unnecessarily produced on the surface or the side face of each region, or controllability of a film thickness or a doping concentration is considerably lowered.

The field stopping layer 47 and the current spreading layer 48 can be omitted. However, when the quality of the SiC substrate 31 is insufficient, provision of the field stopping layer 47 can prevent an electric field with high strength from being applied to the substrate 31 at the end of the drift layer 32 even though the depletion layer expands along the entire drift layer 32 when a reverse voltage is applied. This is preferable because occurrence of insulation breakdown due to low substrate quality can be inhibited.

Since the drift layer 32 has a comparatively high resistance, the current flowing at the on-state in the MIS channel at the interface between the body region 33 and the gate insulator film 36 tends to flow only in the section near the trench 41 in the drift layer 32. This might increase the on-state-resistance due to current concentration. With the current spreading layer 48 being provided, the current flows while spreading in the wide region in the drift layer 32, by which the increase in the on-state-resistance due to current concentration can be favorably inhibited.

The trench 41 can penetrate through the field stopping layer 47 to reach the substrate 31. Furthermore, as shown in FIG. 4-1, the trench 41 can penetrate through the substrate 31.

When a deep trench is formed by etching, etching proceeds fast at the corner of the bottom and the sidewall surface of the trench. This tends to form a trench having corners thereof deeply scooped away. When the bottom of the trench is formed in the middle of the drift layer 32, the shape of the bottom of the trench is likely to affect the characteristics of the device. However, when the trench is formed to reach the field stopping layer 47 as in the first embodiment, the shape of the bottom of the trench beneficially has little influence on the characteristics of the device. Moreover, the sidewall surface of the trench 41 need not be perpendicular to the principal surface of the substrate 31. In particular, of the sidewall surface of the trench 41, a section in contact with the gate insulator film 36 can have such an angle to the principal surface of the substrate 31 as to reduce channel resistance. Furthermore, as shown in FIG. 3-2, the sidewall surface of the trench 41 below the gate electrode 37 can be inclined in a wedge-like shape or trapezoidal in cross section. Moreover, as shown in FIG. 4-2, the entire sidewall surface of the trench 41 can be inclined. The bottom of the trench 41 formed into a thus narrowed area allows the trench, even though it is deep, can be easily filled with the gate insulator film 36.

Furthermore, there is no need to form the sidewall surface of the trench 41 with a combination of only flat surfaces. Namely, the sidewall surface of the trench 41 can be formed only with a curved surface, or with a combination of flat surfaces and curved surfaces.

Moreover, the gate electrode 37 can be provided over the entire thickness of the current spreading layer 48 or along part of the drift layer 32 with the gate insulator film 36 provided between. However, the gate electrode 37 provided down to a region considerably below the drift layer 32 causes an electric field with excessive strength to be unfavorably applied to the gate insulator film 36 around the region.

Furthermore, the surface of the source contact region 34 and the surface of the body contact region 35 need not be formed in flush with each other when the source electrode 39 is in contact with the surfaces of both of the regions. For example, the surface of the body contact region 35 can be provided lower than the surface of the source contact region 34.

In FIG. 3-1 and FIG. 4-1, only one trench is shown for simplifying the drawings. In practice, the device includes a number of the structures, each having the structure shown in FIG. 3-1 or FIG. 4-1, repeated in the lateral direction in the drawings, or in some structures and the arrangements of cells, in the depth direction.

Figure 10:
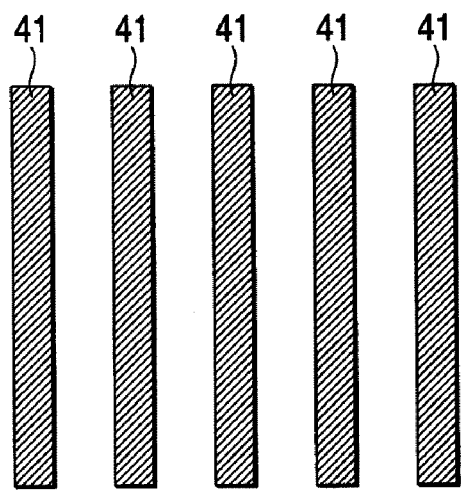
FIG. 10 is a plan view showing an example of the shapes of the trenches in the trench MOSFET shown in FIG. 3-1 or FIG. 4-1.
Figure 11:
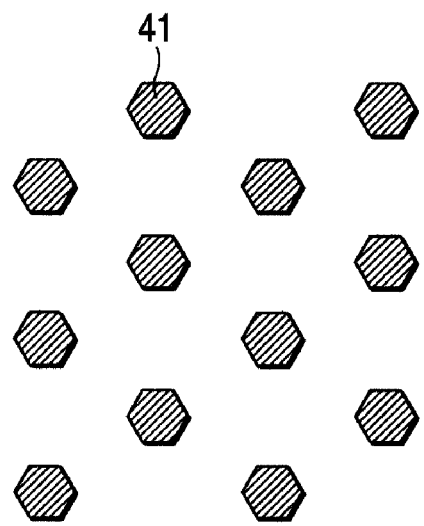
FIG. 11 is a plan view showing an example of the shapes of trenches in a trench MOSFET with a hexagonal cell structure.

FIGS. 10 and 11 are plan views each showing the plane shapes of trenches when the trench MOSFET is viewed from above the source electrode. FIG. 10 shows an example of a stripe cell structure in which there is no variation in the direction of plane in each of the trenches 41 in the depth direction in FIG. 3-1 or FIG. 4-1. FIG. 11 shows an example of a hexagonal cell structure in which each of the trenches 41 and the cells has a hexagonal shape. Thus, any shape of the cell can realize a high breakdown voltage of the device.

In an actual trench MOSFET, the gate electrodes 37 are collected at the end of the device to be taken out to the surface of the device. The way of taking out the gate electrodes is the same as that in a related trench MOSFET of Si.

Figure 12:
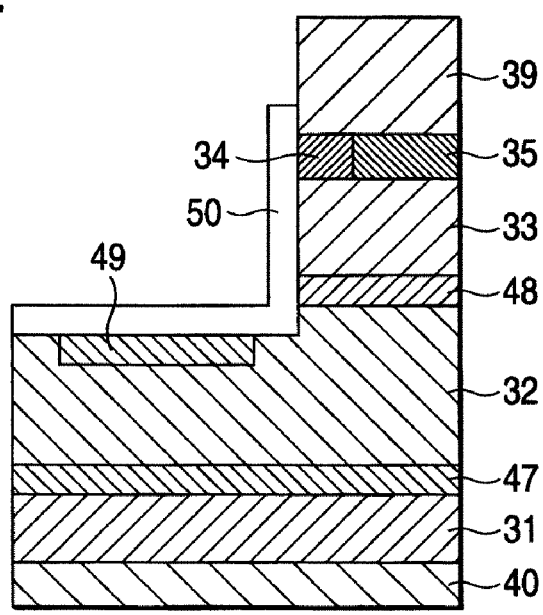
FIG. 12 is a cross-sectional view showing an example of an edge termination structure.
Figure 13:
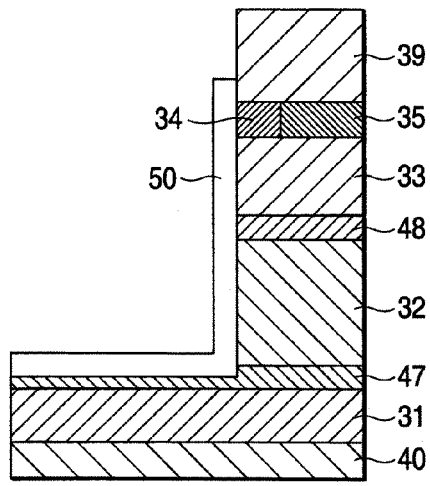
FIG. 13 is a cross-sectional view showing another example of an edge termination structure.

Moreover, in an actual trench MOSFET, for reducing electric field crowding at the end of the device, an edge termination structure is formed. FIGS. 12 and 13 show some examples of such an edge termination structure. In the example shown in FIG. 12, for avoiding electric field crowding, the section from the source contact region 34 to the drift layer 32 (may be the section to the section near the body region in the current spreading layer 48) is cut off, a p-type guard ring region 49 is formed on the part of the surface of the exposed drift layer 32 (or the exposed current spreading layer 48), and a protection insulator film 50 is further formed on the surface of the exposed semiconductor.

In another example shown in FIG. 13, the section to the field stopping layer 47 is further cut out and a protection insulator film 50 is formed for protecting the exposed surface of the semiconductor, by which a so-called mesa structure is provided. Thus, any edge termination structure allows the device to obtain a high breakdown voltage unless the structure is one that significantly reduce the breakdown voltage of the device or one that causes significant electric field crowding in the device.

Next, explanations will be made about a method of forming the trench MOSFET shown in FIG. 3-1. By carrying out epitaxial growth, the forming of the body contact, the forming of an electric field strength reduction structure (JTE (Junction Termination Extension)), the forming of the trench, the forming of the buried oxide film, the forming of the gate oxide film and the forming of the gate electrode in the order, the device is completed. A detailed explanation of each process follows.

For example, an n-type 4H—SiC substrate with a plane with 8° off orientation from the $(0001)_{Si}$ plane taken as the principal surface thereof, or an n-type 4H—SiC substrate with a plane with 8° off orientation from the $(000\overline{1})_C$ plane taken as the principal surface thereof is used. The reason why a substrate having the principal surface with an 8° off orientation angle is used is that the principal surface of a commercially available SiC substrate has the 8° off orientation angle for the epitaxial growth that will be explained later.

In recent years, a substrate having the principal surface with 4° off orientation is commercially available. Thus, when epitaxial growth is possible with the use the substrate, the substrate having the principal surface with 4° off orientation can be used. The effective donor concentration of the substrate is in the middle of the order of $10^{18}$ cm$^{-3}$, for example. The thickness of the substrate is, for example, around 400 μm. This is because the thickness of a commercially available substrate is around 400 μm.

Then, the n-type field stopping layer, the n-type drift layer, the n-type current spreading layer, the p-type body region, and an n$^+$-type source contact layer in the order are deposited on the substrate via epitaxial growth. The field stopping layer has a donor concentration of, for example, 0.5 to 10×10$^{17}$ cm$^{-3}$ and a thickness of, for example, approximately 2 μm. The drift layer has a donor concentration of, for example, approximately 1.6×10$^{16}$ cm$^{-3}$ and a thickness of, for example, approximately 5.7 μm. The current spreading layer has a donor concentration of, for example, approximately 1×10$^{17}$ cm$^{-3}$ and a thickness of, for example, 0.4 μm. The body region has an acceptor density of approximately 2×10$^{17}$ cm$^{-3}$ and a thickness of, for example, approximately 1 μm. The source contact layer has a donor concentration of, for example, 2×10$^{19}$ cm$^{-3}$ and a thickness of, for example, approximately 0.3 μm. A device for carrying out epitaxial growth about a 4H—SiC substrate with a plane with 8° off orientation from the {0001} plane taken as the principal surface thereof is commercially available. Hence, the detailed explanation thereof will be omitted.

The film thickness and the doping concentration of each of the above-explained layers and region are merely an example. The film thickness and the doping concentration is appropriately designed depending on a desired breakdown voltage, other characteristics and a process error to be tolerable. Moreover, each of the layers and region is not necessarily to have a uniform doping concentration, so that a doping concentration can be varied along the direction of deposition.

As an example, the stripe pitch equivalent to the cell pitch in a stripe cell structure is, for example, 14 μm and the width of a trench is, for example, 2 μm. From the consideration of the pitch and the donor concentration of the drift layer, it is known that the structure of the embodiment does not effectively function as a superjunction structure. The theoretical breakdown voltage of the p-n junction formed of the drift layer together with the current spreading layer and the body region is, for example, 1.1 kV.

Subsequent to the epitaxial growth process, plasma CVD is carried out with TEOS and O$_2$ used as source gases to deposit SiO$_2$ with a thickness of, for example, approximately 2 μm on the entire surface of the source contact layer. Then, by a photolithography process, a photoresist mask pattern is formed for forming the body contact region. Thereafter, plasma etching is carried out with, for example, CHF$_3$ used as a reactive gas to form a mask pattern of SiO$_2$.

Thereafter, using O$_2$ plasma, deposits produced while carrying out the etching of SiO$_2$ and the photoresist are removed, by which an SiO$_2$ mask is provided for ion implantation. Then, thermal oxidation is carried out in a wet atmosphere at, for example, 1200° C. for, for example, 30 minutes to form a screen oxide film. Subsequent to this, the sample is heated to, for example, 500° C. to carry out ion implantation with aluminum ions from the surface to a depth of, for example, 0.4 μm so that a box profile is provided with an averaged concentration of 5×10$^{21}$ cm$^{-3}$.

In succession to this, by using buffered hydro-fluoric acid, the screen oxide film and the SiO$_2$ mask are removed. Thereafter, a photoresist is applied again. The applied photoresist is heated up to, for example, approximately 800° C. in an Ar flow to be carbonized to form a carbon cap. Instead of carbonizing the photoresist, the carbon cap can be formed by depositing carbon by, for example, sputtering.

The base body in this state is held in an Ar flow at, for example, approximately 1800° C. for five minutes, by which activation annealing for activating aluminum introduced by ion implantation is carried out. Thereafter, the base body is held in an O$_2$ flow at, for example, approximately 800° C. for an hour to remove the carbon cap. By this process, the body contact region is formed in the part of the source contact layer. The rest of the source contact layer becomes the source contact region.

(JTE Forming Process)

Following the body contact forming process, plasma CVD is carried out to deposit SiO$_2$ with a thickness of, for example, approximately 2 μm on the entire surface of the body contact region side on the base body. Then, by a photolithography process, a photoresist mask pattern is formed for the isolation between the body regions accompanied with the source regions. Thereafter, plasma etching is carried out with, for example, CHF$_3$ used as a reactive gas to form a mask pattern of the SiO$_2$.

Subsequently, using O$_2$ plasma, deposits produced while carrying out the etching of SiO$_2$ and the photoresist are removed, by which an SiO$_2$ mask is provided for RIE (Reactive Ion Etching). Then, plasma etching (RIE) is carried out to leave the necessary part of each of the source contact region and the body region with a part of the rest of each of the source contact region, the body region, the current spreading layer, and the drift layer removed.

The etched depth at this time is, for example, a little less than 2 μm and the width of each of the regions and layers to be removed is sufficiently large. Thus, the regions and layers can be easily removed. This can be easily brought into realization by, for example, ICP (Inductively-Coupled Plasma) with $SF_6$ and $O_2$ used as reactive gases.

Thereafter, like in the forming of the body contact region, ion implantation with aluminum ions is selectively carried out in part of each of the regions and layers, part of each of which was removed by etching. Then, activation annealing for the implanted aluminum ions is carried out. At this time, aluminum is implanted to a depth of, for example, 0.3 μm with an average concentration of, for example, 0.9 to $1 \times 10^{17}$ $cm^{-3}$. The activation annealing for forming the body contact region and the activation annealing for forming the JTE can be simultaneously carried out.

Following the JTE forming process, plasma CVD is carried out to deposit $SiO_2$ with a thickness of, for example, approximately 3.7 μm on the entire surface of the base body on the side of the body contact region. Deposition of such a thick $SiO_2$ often causes cracks. However, sufficiently slow temperature reduction after deposition under an appropriate condition can inhibit generation of cracks in $SiO_2$.

Subsequently, by a photolithography process, a photoresist mask pattern for forming a trench is formed on the $SiO_2$. After this, plasma etching is carried out with, for example, $CHF_3$ used as a reactive gas to form a mask pattern of the $SiO_2$. Thereafter, using, for example, $O_2$ plasma, deposits produced while carrying out the etching of $SiO_2$ and the photoresist are removed, by which an $SiO_2$ mask is provided for RIE (Reactive Ion Etching).

Thereafter, ICP etching (RIE) is carried out with, for example, $SF_6$ and $O_2$ used as reactive gases to form a trench reaching the field stopping layer. In the etching device used by the inventors, by adjusting ICP power and bias power and by adjusting a flow rate and a reaction pressure of each of $SF_6$ and $O_2$ to be a low pressure and a low flow rate, a rate (selectivity) of an etching speed of SiC to an etching speed of $SiO_2$ becomes on the order of 2.3 at the maximum.

Therefore, by carrying out etching under the condition, a trench with a depth of, for example, a little less than 8 μm can be formed. This allows a trench reaching the field stopping layer to be easily formed. The trench can be formed by other methods. For example, as a reactive gas, instead of $SF_6$, $Cl_2$ or HBR can be used, or $CF_4$ or $NF_3$ can be used. These gases are often used in a Si process.

Moreover, an etching device can be that of a parallel plate type or of an ECR (Electron Cyclotron Resonance) type. Furthermore, mask material can be a material having large selectivity to a reactive gas being used. For example, when $SF_6$ or $CF_4$ is used as a reactive gas, a material such as ITO (Indium Tin Oxide) can be used.

Subsequently, with the $SiO_2$ being left, thermal oxidation is carried out under a dry atmosphere at, for example, approximately 1150° C. to form a sacrificial oxide film with a thickness of, for example, approximately 40 nm on the sidewall of the trench. Then, by using buffered hydro-fluoric acid, the sacrificial oxide film and the $SiO_2$ mask are removed. At this time, the $SiO_2$ mask can be left without being completely removed. By forming and removing the sacrificial oxide film, damages produced on the sidewall of the trench at RIE can be removed.

Next to the trench forming process, $SiO_2$ or an insulator including $SiO_2$ as the principal ingredient thereof is buried in the trench. As the methods, the following two will be explained. The methods, however, are not limited to the two. The first method for burying an insulator in the trench will be explained. First, on the principal surface and on the sidewall of the trench, $SiO_2$ or an insulator including $SiO_2$ as the principal ingredient thereof is formed thin. The thin insulator, becoming part of the insulator buried in the trench (the buried insulator 46 in FIG. 3-1), must be formed so that the normal insulation breakdown electric field strength thereof becomes higher than the insulation breakdown electric field strength of the semiconductor. Moreover, the insulator formed on the principal surface (for convenience, hereinafter referred to as $SiO_2$), becoming an etch stop when polysilicon is subjected to etch back in the later process, must have a thickness that matches the selectivity thereof. Furthermore, negative fixed charges produced in the insulator causes an electric field with excessive strength that is undesirably applied to the insulator near the bottom end of the gate electrode. Therefore, the fewest possible negative charges must be produced in the insulator.

For forming such a thin insulator, it is necessary only for the $SiO_2$ mask in the trench forming process to be left without being completely etched out, and then is subjected to thermal oxidation again in a dried atmosphere at, for example, 1150° C. On the surface of the sidewall of the trench, a thermal oxide film is formed with a thickness of, for example, 40 nm. The thin insulator, however, cannot necessarily be formed as this. For example, such a method as the following can be carried out. In the method, plasma CVD is carried out with TEOS and $O_2$ used as source gases to deposit $SiO_2$ with an adequate film thickness, which is annealed with an appropriate atmosphere for an adequate time, for example, with $N_2$ diluted 10% $N_2O$ at 1300° C.

Subsequently, as often carried out in a Si process, polysilicon including phosphorus with a high concentration is deposited on thin $SiO_2$ by, for example, LPCVD. At this time, the polysilicon is deposited so as to have a film thickness on the sidewall surface of the trench on the order of 50 to 70% of the trench width. The best suited film thickness of the polysilicon depends on the denseness of the polysilicon. The polysilicon can include boron in addition to phosphorus.

Thereafter, as being often carried out in a Si process, anisotropic etching of the polysilicon is carried out by plasma etching using, for example, $Cl_2$ or HBr as a reactive gas. At this time, etch back of the polysilicon is carried out so that the top end of the oxide film, formed by subsequent thermal oxidation, comes to be lower than the bottom end of the body region. However, when the top end of the oxide film after the subsequent thermal oxidation is positioned too low, an electric field with excessive strength is unfavorably applied to the oxide film when the device is turned off.

When the $SiO_2$ film formed beforehand on the bottom surface of the trench is too thin compared with the thickness of the $SiO_2$ film to be etched that is determined from the selectivity of polysilicon to $SiO_2$, the $SiO_2$ film on the bottom of the trench is subjected to etching together with the field stopping layer and the substrate of SiC under the bottom of the trench. Incidentally, the thermal oxidation speed of the $(0001)_{Si}$ plane is significantly smaller than those of other planes. Therefore, when the $SiO_2$ film is formed by thermal oxidation with the $(0001)_{Si}$ plane taken as the principal surface of the substrate, a considerably thin $SiO_2$ film is formed at the bottom of the trench. This tends to particularly cause the situation as explained above in which the thin $SiO_2$ film is etched out to cause the layers thereunder to be also etched.

In the field stopping layer and the substrate, however, a little change in the shape of the trench has no influence on a breakdown voltage as far as at least an insulator is buried in SiC being etched. However, care must be taken so that the source contact region and the body contact region are not excessively etched.

Subsequently, the left polysilicon is subjected to thermal oxidation in a dried atmosphere, by which the trench is filled with the buried insulator of an oxide film. By carrying out thermal oxidation in the dried atmosphere, a thermal oxide film tends to lack oxygen to produce positive fixed charges in the oxide film. While, thermal oxidation carried out in a wet atmosphere causes hydroxyl groups to be taken into the thermal oxide film to unfavorably produce negative fixed charges in the oxide film.

Polysilicon before being subjected to thermal oxidation contains phosphorus with a high concentration. This causes the polysilicon to become a so-called PSG (Phospho Silicate Glass) film (a BPSG (Boro-phospho Silicate Glass) film when boron is also contained) having a low softening temperature. When the original polysilicon contains boron, the polysilicon becomes a BPSG film. Therefore, annealing carried out at a high temperature of, for example, 1000° C. allows gaps, produced at the bottom of the trench by the etching of SiC, to be filled by a reflow effect.

The thermal oxidation and the annealing of polysilicon can occur simultaneously. Moreover, a low softening temperature of the formed PSG film allows the thermal stress in the PSG film to continue to be reduced down to a lower temperature. This results in the reduced residual stress in the insulator buried in the trench when the device is completed. This is as is well known in a trench-filling technology for a Si DRAM (Dynamic Random Access Memory).

Furthermore, after carrying out thermal oxidation of the polysilicon, SiN can be deposited on the $SiO_2$ filling the trench. For example, deposition of SiN by LPCVD or plasma CVD causes the SiN to be deposited thicker on the bottom of the trench (here, the top end of the $SiO_2$ filling the trench) than on the sidewall thereof. Therefore, by dipping the device in hot phosphoric acid after the SiN is deposited, the SiN deposited on the sidewall of the trench can be deposited to allow SiN to be left only on the $SiO_2$ in the trench.

A second method for burying an insulator in the trench will be explained. In the second method, LPCVD or plasma CVD, for example, is carried out to directly deposit a PSG film or a BPSG film on the sidewall surface of the trench. Instead, LPCVD with TEOS and $O_2$ used as source gases or plasma CVD, for example, can be also carried out to deposit $SiO_2$ with phosphorus and boron made driven in thereafter.

However, any one of the methods, when carried out for depositing an oxide film at a time, sometimes causes gaps to be left in the trench. Thus, after an oxide film is deposited to some extent of thickness, the deposited oxide film is annealed and made to reflow at a high temperature (for example, 1000° C.). In this way, while repeating deposition and reflow of the oxide film so that no gap is left in the vicinity of the bottom of the trench, a buried oxide film without gap is successively formed from the bottom of the trench.

The forming of the buried oxide film without gap in the whole trench by the method, sometimes causes irregularities on the surface of the oxide film, which can become significant. When the irregularities are significant, polishing is carried out for planarization of the surface with the principal surface of SiC, for example, taken as an etch stop. At the planarization, with the use of, for example, silica as an abrasive, the deposited oxide layer, being softer than silica, is ground.

In comparison, as SiC is far harder than silica, it is ground little. However, temperature rise of the surface of SiC during grinding oxidizes the surface of SiC, which allows the surface to be ground. Thus, it is necessary to keep the surface from excessive temperature rise. When the surface of the oxide film is sufficiently flat, there is no need to carry out grinding for planarization.

Finally, the etch back of the $SiO_2$ in the trench is carried out to a specified depth, by which forming of the buried insulator in the trench is completed. When carrying out the etch back, plasma etching can be carried out with, for example, $CHF_3$ used as a reactive gas. There are some etching conditions where the selectivity of $SiO_2$ to SiC can be 40 or more. Therefore, when carrying out plasma etching with such a requirement being satisfied, there is no problem even though SiC is exposed on the principal surface.

However, on the surface of SiC, a polymerized film is sometimes formed with $CHF_3$. In this case, the polymerized film must be removed by $O_2$ plasma. After this, like in the previously explained first method, SiN can be deposited on the $SiO_2$ buried in the trench.

Next to the buried oxide film forming process, plasma CVD is carried out with, for example, TEOS and $O_2$ used as source gases to form an $SiO_2$ film with a thickness of, for example, 100 nm on the sidewall surface of the trench. Thereafter, annealing is carried out for, for example, an hour with, for example, $N_2$ diluted 10% $N_2O$ at 1300° C. to make the $SiO_2$ film on the sidewall surface of the trench provided as a gate oxide film.

The gate oxide film can be formed by another method. For example, the gate oxide film can be formed only by simply carrying out thermal oxidation. Moreover, after $SiO_2$ is deposited by a method different from the above one, annealing can be carried out by the same method as the above one, or after $SiO_2$ is deposited, annealing can be carried out by a method different from the above one.

However, the gate insulator film must be formed so that a specified gate breakdown voltage is obtained and channel mobility is increased. In the gate oxide film forming process, a protecting insulator film for edge termination is formed together with the gate oxide film.

The above-explained annealing at 1300° C. favorably enhances the breakdown voltage and improves the interface characteristics about not only the gate insulator film but also the $SiO_2$ buried in the trench, namely, the buried insulator and the $SiO_2$ being left on the principal surface before depositing the gate oxide layer. Moreover, when SiN is present on the $SiO_2$ buried in the trench, the SiN favorably has an effect of delaying diffusion of phosphorus atoms or boron atoms into the gate oxide film from the $SiO_2$ buried in the trench.

The processes subsequent to this is, except that a contact with SiC is formed of Ni and high temperature annealing is carried out at, for example, on the order of 1000° C., almost the same as the manufacturing process of a trench MOSFET of Si. Next to the gate oxide film forming process, polysilicon including phosphorus with a high concentration is deposited to fill the trench. Then, the polysilicon is subjected to etch back down to a specified depth to be provided as the gate electrode. Thereafter, the interlayer insulator film of, for example, $SiO_2$ is deposited. Then, by carrying out etching of the interlayer insulator film and films such as $SiO_2$ left on the principal surface in the processes up to this, a source contact hole is formed. At this time, both of the source contact region and the body contact region are exposed in the source contact hole.

Subsequently, a Ni film is deposited on the interlayer insulator film by sputtering. Then, patterning of the Ni film is carried out by wet etching or dry etching, in which the Ni film is patterned a little wider than the contact hole. Instead, a so-called lift-off method can be carried out. In the method, with the photoresist used when forming the contact hole being left, sputtering for depositing a Ni film is carried out and unnecessary part of the Ni film is then removed together with the photoresist.

After the pattern of the Ni film to be the source electrode is formed, $SiO_2$ on the bottom surface of the substrate is removed and a Ni film is deposited on the bottom surface of the substrate by sputtering. Thereafter, contact annealing is carried out at a temperature of the order of, for example, 1000° C. Finally, a contact hole is formed in a gate pad, and an Al film is made deposited on the surface on the source electrode side by sputtering. The deposited Al film is then subjected to patterning, by which the device is completed.

Next, the results of evaluations will be explained which were carried out about the trench MOSFETs prepared by the above-explained various manufacturing methods with the use of an n-type 4H—SiC substrate with a plane with 8° off orientation from the $(0001)_{Si}$ plane taken as the principal surface thereof and an n-type 4H—SiC substrate with a plane with 8° off orientation from the $(000\bar{1})_C$ plane taken as the principal surface thereof. With any substrate and process, the prepared devices exhibited well on-characteristics of MOSFETs.

The on-state-resistance of the device was on the order of 7 m$\Omega$cm$^2$. Moreover, with the use of any substrate, an average value of breakdown voltages at the tuning off was on the order of 1050V in the devices prepared in most of the processes. Furthermore, negative temperature coefficient was exhibited in the breakdown voltage at the off-state. From this, it is considered that approximately uniform avalanche breakdown occurs at the interface between the body region and the current spreading layer.

However, in the above-explained first method of forming the buried oxide film, an unfavorable result was obtained as explained below about the devices in each of which polysilicon was oxidized in a wet atmosphere. Namely, although some devices exhibited breakdown voltages exceeding 1000 v about the breakdown voltages at the off-state, most of the devices had low breakdown voltages with large variations. Moreover, when an applied voltage to each of the devices is gradually made raised from 0V, many of the devices had their respective leak currents abruptly increased in the course of raising the applied voltages to result in insulation breakdown.

In many of such devices, although each of the applied voltages was kept constant at the time when the leak current began to increase, the leak current increased with time to result in insulation breakdown. Such a phenomenon like variation with time is often observed in amorphous material such as $SiO_2$. Furthermore, the device was observed to have a tendency to reduce the breakdown voltage thereof with an increase in measured temperature.

The insulation breakdown electric field strength of SiC increases with an increase in temperature. However, it is known that the normal insulation breakdown electric field strength of $SiO_2$ reduces with an increase in temperature. From this, it is considered that the reduction in breakdown voltage is caused by insulation breakdown occurring in the oxide film buried in the trench. Moreover, it is considered that the variation in breakdown voltage is caused by variation in the negative fixed charge density in the oxide film. It is unfavorable that the insulator buried in the trench thus has a large amount of negative fixed charges.

For comparison, devices were also prepared in each of which a trench was provided without being deeply formed with a depth down to directly below a gate electrode. In each of the device for comparison, a gate oxide film was deposited by plasma CVD with TEOS and $O_2$ used as source gases. Thus, oxide films with the thicknesses thereof being approximately equal to each other are respectively formed on the sidewall surface and the bottom surface of the trench. In such a device, the breakdown voltage thereof was only on the order of 600 to 800V or less with a large variation.

In some of the devices for comparison, continuous application of a voltage near the breakdown voltage for a long time caused a gradual increase in leak current, which resulted in final insulation breakdown. In such a device, one of the causes of the insulation breakdown is considered to be the structure of the device that allows electric field concentration to be liable to occur in the oxide film near the bottom of the trench. The other cause is considered to be the relative permittivity of the oxide film that is smaller than that of SiC to therefore allow an electric field with the strength thereof being higher than the strength of the electric field in SiC to be applied to the oxide film. Hence, as in the first embodiment, a structure in which a trench is formed to reach a field stopping layer with an insulator buried in a section beneath a gate electrode is favorably provided.

According to the first embodiment, the trench 41 reaches the field stopping layer 47 as a highly doped layer on the drain side. This allows electric fields approximately equal to each other in strength to be respectively applied to the semiconductor and the buried insulator 46 in the trench 41 regardless of large and small in relative permittivity according to laws in the electromagnetics. Therefore, even though the insulation breakdown electric field strength and relative permittivity product of the semiconductor is larger than the normal insulation breakdown electric field strength and relative permittivity product of the insulator, the normal insulation breakdown electric field strength is equal to or a little larger than the insulation breakdown electric field strength of the semiconductor. This enables realization of a high breakdown voltage without occurrence of first insulation breakdown of the insulator that causes a short circuit between the gate and the drain.

Figure 14:
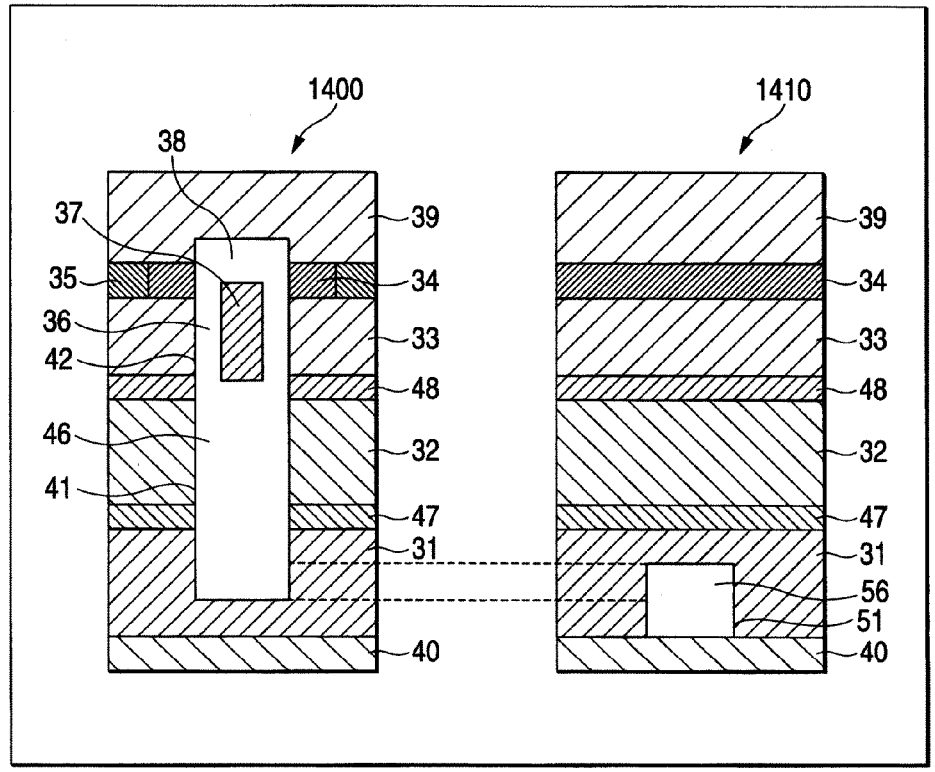
FIG. 14 is a view showing a front cross section and a side-cross section of an arrangement of a principal part of a trench MOSFET according to a second embodiment according to the invention.
Figure 15:
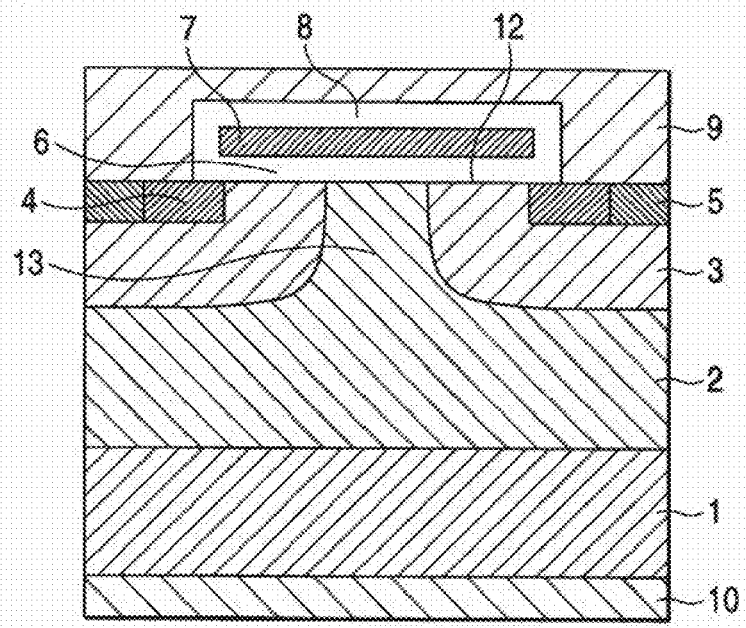
FIG. 15 is a cross-sectional view showing an example of a structure of a related vertical MOSFET of a DMOSFET type.
Figure 16:
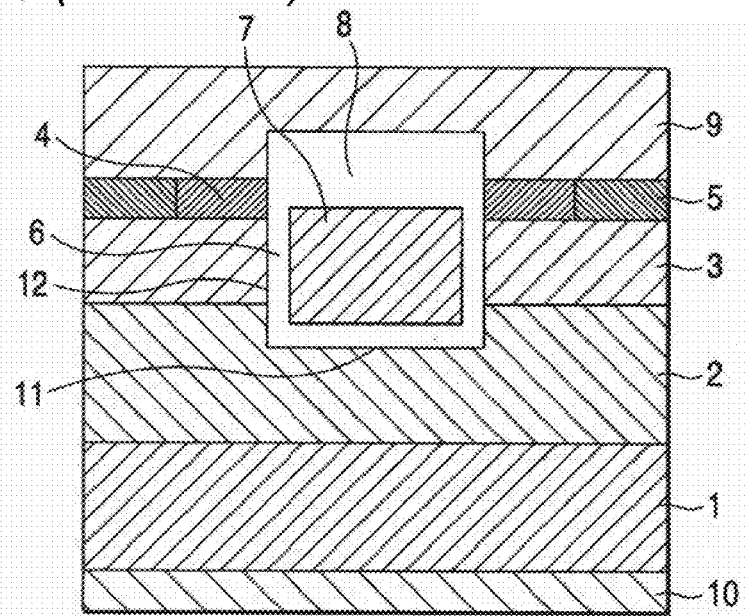
FIG. 16 is a cross-sectional view showing an example of a structure of a related vertical MOSFET of a trench MOSFET type.
Figure 17:
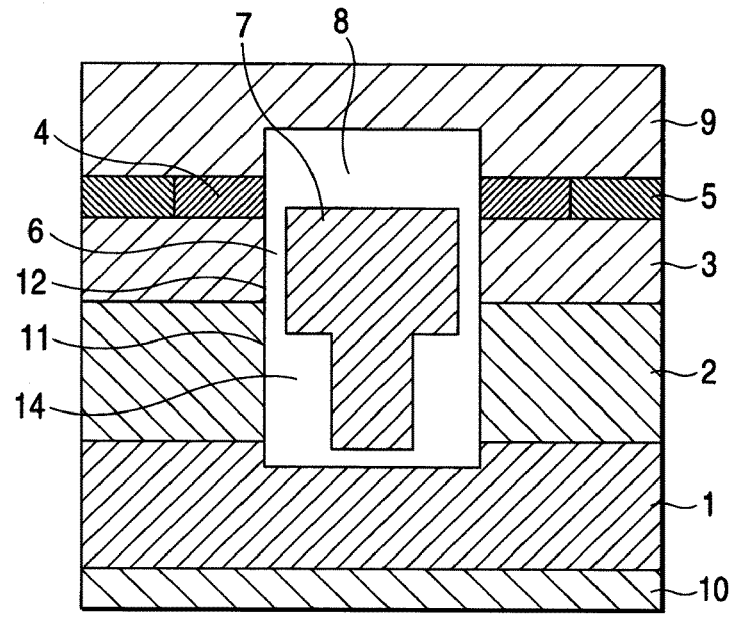
FIG. 17 is a cross-sectional view showing another example of a structure of a related vertical MOSFET of a trench MOSFET type.
Figure 18:
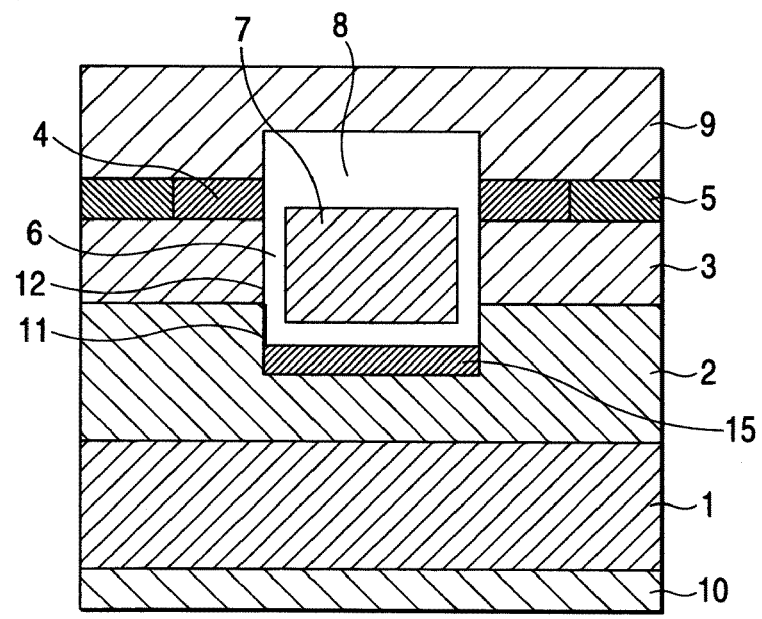
FIG. 18 is a cross-sectional view showing yet another example of a structure of a related vertical MOSFET of a trench MOSFET type.

Referring to FIG. 14, which shows an arrangement of a principal part of a trench MOSFET according to the second embodiment according to the present invention, as shown by the cross-sectional view 1400 the trench 41 is formed to penetrate through the field stopping layer 47 and reach a deeper section in the substrate 31. Moreover, as shown in the side cross sectional view 1410, the bottom surface side of the substrate 31 is further partly cut out (not shown) to reduce the on-state-resistance. Furthermore, from the part of the bottom surface having been cut out, there is formed a back trench 51 that is not parallel with the trench 41. By making the back trench 51 and the trench 41 cross each other, an opening is provided at the bottom surface of the trench 41. Through the opening, the inner wall surface of the trench 41 is continuously linked with the inner wall surface of the back trench 51. Thus, the inner wall surface of the trench 41 is connected to the bottom surface of the substrate 31 through the inner wall surface of the back trench 51.

The back trench 51 is filled with an insulator 56. By providing such an arrangement, the process of filling the trench 41 and the back trench 51 with the insulator 56 can be simplified. As shown in FIG. 14, the trench 41 and the back trench 51 can be provided so as to be approximately perpendicular to each other. Moreover, the trench 41 and the back trench 51, when provided so as to simply cross each other, need not be perpendicular to each other. The other arrangements are the same as those of the first embodiment.

Next, explanations will be made about a method of forming the trench MOSFET shown in FIG. 14. By carrying out epitaxial growth, the forming of the body contact, the thinning of the bottom surface side and the forming of the back trench, the forming of an electric field strength reduction structure (JTE), the forming of the trench, the forming of the buried oxide film, the forming of the gate oxide film and the forming of the gate electrode in the order, the device is completed. A detailed explanation of each process follows.

An epitaxial growth process and a body contact forming process are carried out in the order. Both of the processes are the same as those in the first embodiment. Therefore, the explanations thereof become redundant and will be omitted. However, in the second embodiment, an n-type 4H—SiC substrate with a plane with 8° off orientation from the (0001)$_{Si}$ plane taken as the principal surface thereof, for example, is used.

Next to the body contact forming process, an Al film with a thickness of, for example, 4 μm is deposited on the bottom surface of the substrate. Then, etching is carried out from the principal surface only about a region near the section where the trench 41 is formed to provide a mask for etching SiC. Thereafter, etching of SiC is carried out by high density ICP with, for example, $SF_6$ and $O_2$ using as reactive gases. The deposition of the Al film and the etching processing of SiC are repeatedly carried out. An accuracy of the alignment at this time is not so severe as the accuracy of the alignment with a pattern on the principal surface side.

With the use of the high density plasma, an etching speed of SiC becomes, for example, 18 μm/minute or more. The selectivity to Al is so high as 15 or more that, for example, approximately 60 μm of SiC can be etched by one time of Al deposition and etching. Therefore, by repeating the processing, for example, seven to eight times, the thickness of the rest of SiC is made, for example, 50 μm in the region near the section where the trench 41 is formed from the principal surface.

The bottom surface side of the substrate can be thinned by another method. For example, instead of Al, a material with high selectivity such as ITO can be deposited on the bottom surface of the substrate. Moreover, as a substitute for the plasma etching method, an etching method such as FIB (Focused Ion Beam) process or sand blasting can be used. Instead, when the bottom surface of the substrate is approximately of the $(000\bar{1})_C$ plane, a wet etching method using molten KOH or molten NaOH can be applied with Al or Ni used as a mask.

After thinning the bottom surface side of the substrate, by using the Al film patterned for forming the back trench 51 as a mask, etching is carried out like that in the above-explained bottom surface side thinning processing, by which the back trench 51 is formed with a width of, for example, approximately 20 μm and a depth of, for example, approximately 30 μm. The back trench 51 need not be as fine as the trench 41 formed on the principal surface side. Moreover, the back trench 51 not parallel with the trench 41 on the principal surface side allows an opening to be provided at the bottom of the trench 41 on the principal surface side. Therefore, precise orientation of the back trench 51 is not necessary.

The JTE forming process is the same as that in the first embodiment. Therefore, the explanation thereof is omitted.

Next to the JTE forming process, the trench 41 is formed from the principal surface. For making the trench 41 reach the back trench 51, etching must be carried out to a depth of the order of 20 μm. This requires an etching technique carried out with higher selectivity than in the device in the first embodiment. Use of a gas including fluorine such as $SF_6$ as a reactive gas makes it difficult to enhance the selectivity to $SiO_2$ because the bond strength of the Si—F bond and the bond strength of the Si—C bond are approximately equal. Even though a material with high selectivity such as ITO is deposited on the principal surface side, this only makes microfabrication difficult. Against this, it is considered that the use of a material with considerably weak bond strength to Si, a material such as Br, for example, can enhance the selectivity to $SiO_2$. Therefore, with ICP, using HBr and $O_2$ as reactive gases, applied here, etching is carried out under a condition with a weak sputtering action.

The etching carried out under the condition allows selectivity of the order of 10 to be obtained. A similar method about the etching of polycrystalline SiC is reported by Di Gao et al., Applied Physics Letters, Vol. 82, No. 11, 17 Mar. 2003, pp. 1742-1744 (2003). The other items of processing in the trench forming process are the same as those in the first embodiment 1.

Next to the trench forming process, $SiO_2$ films are formed as follows on the principal surface, the sidewall surface, and the bottom surface (except for the section where the trench 14 is connected to the back trench 51 to cause the absence of SiC) of the trench 41 and the sidewall surface and the bottom surface of the back trench 51 (the bottom surface becomes the top surface of the back trench 51 in the side cross sectional view 1410 in FIG. 14).

First, thermal oxidation is carried out in a dry atmosphere at, for example, 1150° C., by which a $SiO_2$ film is formed on the bottom surface of the substrate with a specified thickness of, for example, 40 nm because the bottom surface of the substrate is the $(000\bar{1})_C$ plane with a large thermal oxidation speed. Since each of the principal surface and the bottom surface of the trench 41 is the $(0001)_{Si}$ plane, there is little progress of oxidation on the principal surface and the bottom surface of the trench 41.

On the bottom surface of the trench 41, a $SiO_2$ film is formed with a thickness of the order of, for example, 4 nm. On the principal surface, by leaving the $SiO_2$ mask, formed in the trench forming process, without being completely etched out, a $SiO_2$ film is present which is thicker than the $SiO_2$ film on the bottom surface of the trench 41. On the side surface of the trench 41, a $SiO_2$ film is present with a thickness being intermediate between that of the $SiO_2$ film on the $(0001)_{Si}$ plane and that of the $SiO_2$ film on the $(000\bar{1})_C$ plane.

Subsequently, while applying suction over the whole surface on the principal surface side, BPSG dissolved in a solvent is fed from the side of the bottom surface of the substrate while being made dropped onto the bottom surface. Such BPSG is commercially available. The presence of $SiO_2$ films on the principal surface and the sidewall and the bottom surface of each of the trench 41 and the back trench 51 allows the BPSG to flow along the $SiO_2$ films to gradually fill the trench 41 and the back trench 51 from the bottom surface of the substrate toward the principal surface.

The gradual increasing of the BPSG concentration in the solvent allows the trench 41 and the back trench 51 to be gradually filled with BPSG with the concentration thereof gradually becoming higher. At this time, the BPSG concentration can be increased gradually or increased stepwise. However, abrupt increase in viscosity of the BPSG accumulated on the bottom surface of the thinned substrate will sometimes stop the flow of the BPSG or interrupt the supply of the BPSG without letting the BPSG enter the trench 41 and the back trench 51. Therefore, care must be taken not to cause such an abrupt increase in viscosity of the BPSG.

While, too lower concentration of the BPSG in the solvent causes possible inconvenience of producing cracks in the film when baking is carried out later or making it impossible to obtain a specified insulation breakdown electric field strength. Therefore, it is unfavorable to carry out encapsulation with BPSG with an excessively low concentration.

Thereafter, the application of suction over the principal surface is stopped and, with a similar method to spin coating, makes the BPSG flowing around the principal surface uniform. At this time, suction is preferably applied from the bottom surface of the substrate. The suction at this time, however, must be carried out with care so as not to apply inverse suction to the BPSG. Thereafter, the BPSG is baked for hardening.

Thereafter, using buffered hydro-fluoric acid, for example, the BPSG accumulated on the bottom surface of the substrate is removed. Furthermore, etching by $CHF_3$ plasma and cleaning by $O_2$ plasma can be carried out. Thereafter, in the same way as that in the first embodiment, the $SiO_2$ is etched back from the principal surface to a specified depth, by which the formation of the buried insulator 46 buried in the trench 41 and the insulator 56 buried in the back trench 51 is completed. Moreover, SiN can be deposited on the buried insulator 46 in the trench 41.

Thereafter, the processes from the forming of the gate oxide film to the completion of the device are the same as those in the first embodiment.

The result of evaluation will be explained which were carried out about the trench MOSFETs prepared by the above-explained manufacturing method according to the second embodiment with the use of n-type 4H—SiC substrates each with a plane with 8° off orientation from the $(0001)_{Si}$ plane taken as the principal surface thereof. The prepared devices exhibited well on-characteristics of MOSFETs. The on-state-resistance of each of the devices was on the order of 5 mΩcm², which was on the order of 70% of that of the device according to the first embodiment. The reason is believed that the thinner substrate reduced the resistance thereof.

The averaged value of the breakdown voltages of the devices at the turned off was on the order of 1050V, which was approximately equal to that in the first embodiment. However, when the BPSG buried in the trench 41 was formed by using a solution in which BPSG was dissolved in a solvent with a too low concentration, there were some batches in which the averaged value of the breakdown voltages of the devices at the turned off became 300V or less. The reason is considered that BPSG having too low concentration in the solvent causes considerable reduction in not only the normal insulation breakdown electric field strength but also instantaneous insulation breakdown electric field strength.

According to the second embodiment 2, like the first embodiment, an effect can be obtained that inhibits occurrence of short circuit between the gate and the drain to enable realization of a high breakdown voltage. Moreover, by thinning the bottom surface side of the substrate, a section in which current flow of the bottom surface side of the substrate is thinner, by which the on-state-resistance can be reduced. While, in the region outside of the device where no current flows, the thick substrate 31 is left with the thickness thereof being kept unchanged, by which the mechanical strength of the device can be maintained. Furthermore, since the inner wall surface of the trench 41 is connected to the bottom surface of the substrate 31 through the inner wall surface of the back trench 51, an insulator can be easily buried in the trench.

The present device is not limited to the above-explained embodiments but can be variously modified. For example, the material of the substrate 31 can be 4H—SiC or 6H—SiC with the {11 $\overline{2}$ 0} plane thereof taken as the principal surface, 6H—SiC with the {01 $\overline{1}$ 4} plane thereof taken as the principal surface or 4H—SiC with the {03 $\overline{3}$ 8} plane thereof taken as the principal surface. The normal insulation breakdown electric field strength of the buried insulator 46 can be 1.8 MV/cm or more and the normal insulation breakdown electric field strength and relative permittivity product thereof can be 18 MV/cm or less.

Moreover, the material of the substrate 31 can be 3C—SiC. In this case, the normal insulation breakdown electric field strength of the buried insulator 46 can be 1.5 MV/cm or more and the normal insulation breakdown electric field strength and relative permittivity product thereof can be 15 MV/cm or less. Furthermore, the disclosure of the present invention can be effectively applied not only to the $SiO_2$/SiC system device but also to a $SiO_2$/GaN system device and a Low-k (low permittivity material)/SiC system device.

The normal insulation breakdown electric field strength of an insulator buried in a trench is equivalent to or larger than the insulation breakdown electric field strength of a semiconductor. Moreover, an electric field with the strength thereof approximately equal to the other is applied to each of the insulator in the trench and the semiconductor regardless of large and small in values of relative permittivities thereof. Therefore, insulation breakage occurs earlier on the semiconductor side than in the insulator in the trench. Thus, a short circuit occurs between the source and the drain before a short circuit occurs between the gate and the drain. The semiconductor device according to the invention can inhibit a short circuit between the gate and the drain due to breakage of the insulation film at the bottom of the trench. This gives the effect of enabling realization of a device with a high breakdown voltage. As was explained in the foregoing, the semiconductor device according to the invention is useful for a SiC device and is particularly suited for a vertical trench MISFET.

While the present invention has been particularly shown and described with reference to preferred embodiment thereof, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, JP PA 2006-008995 filed on 17 Jan. 2006. The disclosure of the priority application, in its entirety, including the drawings, claims, and the specification thereof, is incorporated herein by reference.

What is claimed is:

1. A semiconductor device comprising:
   a base body formed of semiconductor material, the base body having a trench formed from the top surface thereof;
   a body region provided on the top surface side of the base body;
   a source region provided on the top surface side of the body region;
   a drain region provided on the bottom surface side of the base body;
   a drift layer provided in the base body between the source region and the drain region;
   a highly doped layer forming at least part of the drain region;
   a gate insulator film formed of insulating material provided at least on sidewall surfaces of the trench; and
   a gate electrode provided in the trench with the gate insulator film provided at least between the sidewall surfaces of the trench,
   wherein a product of a value of an insulation breakdown electric field strength and a value of a relative permittivity of the semiconductor material forming the base body is larger than a product of a normal value of an insulation breakdown electric field strength and a value of a relative permittivity of the insulating material forming the gate insulator film, wherein the trench penetrates the base body and the drift layer and reaches the highly doped layer on the drain region side, wherein a section of the trench deeper than the gate electrode is filled with an insulator having a normal value of an insulation breakdown electric field strength equal to or higher than the value of the insulation breakdown electric field strength of the semiconductor material of the base body, wherein the insulator at the bottom end of the gate electrode is thicker than the drift layer, wherein the sidewall surfaces of the trench located below the gate electrode is inclined to form a trapezoidal profile, and wherein the semiconductor material forming the base body is SiC, and each of the gate insulator film and the insulator filling the trench is $SiO_2$.

2. The semiconductor device as claimed in claim 1, wherein a semiconductor region becoming the drift layer is of an n type and fixed charges existing in the insulator filling the trench are positive.

3. The semiconductor device as claimed in claim 2, wherein, when an electric field is applied to the base body side of an interface between the insulator filling the trench and the base body in such a way as to be perpendicular to the interface with a value of strength becoming $\sqrt{5/9}$ times of the value of the insulation breakdown electric field strength of the semiconductor material forming the base body, the drain region and a semiconductor region becoming a body region in the base body have characteristics where the drain region and the semiconductor region becoming the body region are not completely isolated from each other by a depletion layer spreading into the semiconductor region in the base body and by the insulator filling the trench.

4. The semiconductor device as claimed in claim 2, wherein, letting the value of the insulation breakdown electric field strength and the value of the relative permittivity of the semiconductor material forming the base body be $E_S$ and $\epsilon_S$, respectively, and letting the normal value of the insulation breakdown electric field strength and a value of a relative permittivity of the insulator filling the trench be $E_I$ and $\epsilon_I$, respectively, when an electric field is applied to the base body side of an interface between the insulator filling the trench and the base body in such a way as to be perpendicular to the interface with a value of strength becoming $\{(E_I/E_S)^2-1\}/\{(\epsilon_S/\epsilon_I)^2-1\}$ times of $E_S$, the drain region and a semiconductor region becoming a body region in the base body have characteristics where the drain region and the semiconductor region becoming the body region are not completely isolated from each other by a depletion layer spreading over in the insulator filling the trench and the semiconductor region in the base body.

5. The semiconductor device as claimed in claim 1, wherein a semiconductor region becoming the drift layer is of a p type and fixed charges existing in the insulator filling the trench are negative.

6. The semiconductor device as claimed in claim 5, wherein, when an electric field is applied to the base body side of an interface between the insulator filling the trench and the base body in such a way as to be perpendicular to the interface with a value of strength becoming $\sqrt{5/9}$ times of the value of the insulation breakdown electric field strength of the semiconductor material forming the base body, the drain region and a semiconductor region becoming a body region in the base body have characteristics where the drain region and the semiconductor region becoming the body region are not completely isolated from each other by a depletion layer spreading into the semiconductor region in the base body and by the insulator filling the trench.

7. The semiconductor device as claimed in claim 5, wherein, letting the value of the insulation breakdown electric field strength and the value of the relative permittivity of the semiconductor material forming the base body be $E_S$ and $\epsilon_S$, respectively, and letting the normal value of the insulation breakdown electric field strength and a value of a relative permittivity of the insulator filling the trench be $E_I$ and $\epsilon_I$, respectively, when an electric field is applied to the base body side of an interface between the insulator filling the trench and the base body in such a way as to be perpendicular to the interface with a value of strength becoming $\{(E_I/E_S)^2-1\}/\{(\epsilon_S/\epsilon_I)^2-1\}$ times of $E_S$, the drain region and a semiconductor region becoming a body region in the base body have characteristics where the drain region and the semiconductor region becoming the body region are not completely isolated from each other by a depletion layer spreading over in the insulator filling the trench and the semiconductor region in the base body.

8. The semiconductor device as claimed in claim 7, wherein the value of the relative permittivity of the gate insulator film is larger than the value of the relative permittivity of the insulator filling the trench.

9. The semiconductor device as claimed in claim 1, wherein, when an electric field is applied to the base body side of an interface between the insulator filling the trench and the base body in such a way as to be perpendicular to the interface with a value of strength becoming $\sqrt{5/9}$ times of the value of the insulation breakdown electric field strength of the semiconductor material forming the base body, the drain region and a semiconductor region becoming a body region in the base body have characteristics where the drain region and the semiconductor region becoming the body region are not completely isolated from each other by a depletion layer spreading into the semiconductor region in the base body and by the insulator filling the trench.

10. The semiconductor device as claimed in claim 1, wherein, letting the value of the insulation breakdown electric field strength and the value of the relative permittivity of the semiconductor material forming the base body be $E_S$ and $\epsilon_S$, respectively, and letting the normal value of the insulation breakdown electric field strength and a value of a relative permittivity of the insulator filling the trench be $E_I$ and $\epsilon_I$, respectively, when an electric field is applied to the base body side of an interface between the insulator filling the trench and the base body in such a way as to be perpendicular to the interface with a value of strength becoming $\{(E_I/E_S)^2-1\}/\{(\epsilon_S/\epsilon_I)^2-1\}$ times of $E_S$, the drain region and a semiconductor region becoming a body region in the base body have characteristics where the drain region and the semiconductor region becoming the body region are not completely isolated from each other by a depletion layer spreading over in the insulator filling the trench and the semiconductor region in the base body.

11. The semiconductor device as claimed in claim 1, wherein the semiconductor material forming the base body is 4H—SiC with the {0001} plane thereof taken as a principal surface of the base body, the normal value of the insulation breakdown electric field strength of the insulator filling the trench is 2.5 MV/cm or more, and a product of the normal value of the insulation breakdown electric field strength and the value of the relative permittivity of the insulator is 25 MV/cm or less.

12. The semiconductor device as claimed in claim 11, wherein a plane of the semiconductor material forming the base body, the plane having an off orientation angle of 10° or less from the crystal plane of the semiconductor material, is taken as the principal surface of the base body.

13. The semiconductor device as claimed in claim 11, wherein the value of the relative permittivity of the gate insulator film is larger than the value of the relative permittivity of the insulator filling the trench.

14. The semiconductor device as claimed in claim 1, wherein the semiconductor material forming the base body is one of 4H—SiC with the {11 $\bar{2}$ 0} plane thereof taken as a principal surface of the base body, 6H—SiC with the {11 $\bar{2}$ 0} plane thereof taken as a principal surface of the base body, 6H—SiC with the {01 $\bar{1}$ 4} plane thereof taken as a principal surface of the base body, or 4H—SiC with the {03 $\bar{3}$ 8} plane thereof taken as a principal surface of the base body, and the normal value of the insulation breakdown electric field strength of the insulator filling the trench is 1.8 MV/cm or more, and a product of the normal value of the insulation breakdown electric field strength and the value of the relative permittivity of the insulator is 18 MV/cm or less.

15. The semiconductor device as claimed in claim 14, wherein the value of the relative permittivity of the gate insulator film is larger than the value of the relative permittivity of the insulator filling the trench.

16. The semiconductor device as claimed in claim 1, wherein the semiconductor material forming the base body is 3C—SiC, the normal value of the insulation breakdown electric field strength of the insulator filling the trench is 1.5 MV/cm or more, and a product of the normal value of the insulation breakdown electric field strength and the value of the relative permittivity of the insulator is 15 MV/cm or less.

17. The semiconductor device as claimed in claim 1, wherein the value of the insulation breakdown electric field strength of the semiconductor material forming the base body is 3 MV/cm or less, the product of the value of the insulation breakdown electric field strength and the value of the relative permittivity of the semiconductor material is 12 MV/cm or more.

18. The semiconductor device as claimed in claim 1, wherein the value of the relative permittivity of the gate insulator film is larger than the value of the relative permittivity of the insulator filling the trench.

19. A method of forming a semiconductor device comprising the steps of:
   forming a base body formed of semiconductor material, the base body having a trench formed from the top surface thereof;
   forming a body region provided on the top surface side of the base body;
   forming a source region provided on the top surface side of the body region;
   forming a drain region provided on the bottom surface side of the base body;
   forming a drift layer provided in the base body between the source region and the drain region;
   forming a highly doped layer forming at least part of the drain region;
   forming a gate insulator film formed of insulating material provided at least on sidewall surfaces of the trench; and
   forming a gate electrode provided in the trench with the gate insulator film provided at least between the sidewall surface of the trench,
   wherein a product of a value of an insulation breakdown electric field strength and a value of a relative permittivity of the semiconductor material forming the base body is larger than a product of a normal value of an insulation breakdown electric field strength and a value of a relative permittivity of the insulating material forming the gate insulator film,
   wherein the trench penetrates the base body and the drift layer and reaches the highly doped layer on the drain region side,
   wherein a section of the trench deeper than the gate electrode is filled with an insulator having a normal value of an insulation breakdown electric field strength equal to or higher than the value of the insulation breakdown electric field strength of the semiconductor material of the base body,
   wherein the insulator at the bottom end of the gate electrode is thicker than the drift layer,
   wherein the sidewall surfaces of the trench located below the gate electrode is inclined to form a trapezoidal profile, and
   wherein the semiconductor material forming the base body is SiC, and each of the gate insulator film and the insulator filling the trench is SiO2.

* * * * *